(12) United States Patent
Woo et al.

(10) Patent No.: US 12,144,169 B2
(45) Date of Patent: Nov. 12, 2024

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Jong Sung Woo, Hwaseong-si (KR); Yong Kyu Lee, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 17/695,341

(22) Filed: Mar. 15, 2022

(65) Prior Publication Data

US 2023/0005939 A1 Jan. 5, 2023

(30) Foreign Application Priority Data

Jul. 1, 2021 (KR) .................. 10-2021-0086200

(51) Int. Cl.
| | |
|---|---|
| *H10B 41/35* | (2023.01) |
| *H01L 29/423* | (2006.01) |
| *H01L 29/66* | (2006.01) |
| *H10B 41/10* | (2023.01) |
| *H10B 41/41* | (2023.01) |

(52) U.S. Cl.
CPC ....... *H10B 41/35* (2023.02); *H01L 29/42328* (2013.01); *H01L 29/66825* (2013.01); *H10B 41/10* (2023.02); *H10B 41/41* (2023.02)

(58) Field of Classification Search
CPC ........ H10B 41/35; H10B 41/10; H10B 41/41; H10B 41/30; H10B 41/49; H01L 29/42328; H01L 29/66825; H01L 29/0649; H01L 29/788; H01L 21/823864
See application file for complete search history.

(56) References Cited

U.S. PATENT DOCUMENTS

| | | | |
|---|---|---|---|
| 9,276,008 B2 | 3/2016 | Cheek et al. | |
| 9,343,537 B2 | 5/2016 | Tang | |
| 9,455,322 B1* | 9/2016 | Chiu | ................. H01L 29/40114 |
| 9,484,351 B2 | 11/2016 | Wu et al. | |
| 9,716,097 B2 | 7/2017 | Wu et al. | |
| 9,978,758 B1* | 5/2018 | Liu | ..................... H01L 21/0214 |
| 10,332,882 B2 | 6/2019 | Chuang et al. | |
| 10,903,366 B1 | 1/2021 | Chen et al. | |
| 2003/0052360 A1* | 3/2003 | Guterman | .............. H10B 41/30 257/315 |
| 2004/0065917 A1* | 4/2004 | Fan | ................... H01L 29/42328 257/315 |

(Continued)

*Primary Examiner* — Bitew A Dinke
(74) *Attorney, Agent, or Firm* — Sughrue Mion, PLLC

(57) ABSTRACT

Provided is a semiconductor device. The semiconductor device includes a floating gate disposed on a substrate; a memory gate disposed on the floating gate; a first spacer disposed sidewalls of the floating gate and the memory gate, and an upper surface of the substrate; a second spacer disposed on the first spacer; a select high-k film disposed on a first portion of a sidewall of the first spacer between the substrate and the second spacer; and a select gate disposed on a second portion of the sidewall of the first spacer between the substrate and the second spacer. A width of a portion of the first spacer is reduced as a distance to the substrate decreases, and the portion of the first spacer is disposed between the substrate and the second spacer.

20 Claims, 29 Drawing Sheets

(56) References Cited

U.S. PATENT DOCUMENTS

| | | | |
|---|---|---|---|
| 2004/0105319 A1* | 6/2004 | Jeng | H10B 41/30 |
| | | | 257/E21.422 |
| 2008/0049517 A1* | 2/2008 | Hung | H01L 29/42324 |
| | | | 257/E21.209 |
| 2008/0099789 A1* | 5/2008 | Kotov | H10B 41/30 |
| | | | 438/257 |
| 2009/0231921 A1 | 9/2009 | Kimura et al. | |
| 2014/0239367 A1* | 8/2014 | Saito | H10B 43/35 |
| | | | 438/266 |
| 2015/0280004 A1* | 10/2015 | Wu | H01L 29/40114 |
| | | | 438/594 |
| 2015/0333173 A1* | 11/2015 | Wu | H01L 29/788 |
| | | | 257/320 |
| 2015/0364558 A1* | 12/2015 | Wu | H01L 29/6656 |
| | | | 438/257 |
| 2015/0372121 A1* | 12/2015 | Chen | H01L 29/7883 |
| | | | 438/593 |
| 2016/0027517 A1* | 1/2016 | Kim | G11C 16/12 |
| | | | 365/185.33 |
| 2017/0110194 A1* | 4/2017 | Tiwari | H10B 43/27 |
| 2017/0125603 A1* | 5/2017 | Zhou | H01L 29/7883 |
| 2018/0012898 A1* | 1/2018 | Wu | H01L 29/42328 |
| 2018/0076206 A1* | 3/2018 | Yoshitomi | H01L 29/66833 |
| 2018/0102414 A1* | 4/2018 | Liu | H01L 29/66825 |
| 2018/0158833 A1* | 6/2018 | Richter | H10B 41/10 |
| 2018/0233509 A1* | 8/2018 | Cai | G11C 16/0491 |
| 2019/0165115 A1* | 5/2019 | Lin | H01L 29/42368 |
| 2020/0202946 A1* | 6/2020 | Bo | H10B 41/00 |
| 2021/0036118 A1* | 2/2021 | Lin | H10B 41/30 |
| 2021/0376120 A1* | 12/2021 | Chen | H10B 41/30 |
| 2023/0292504 A1* | 9/2023 | Jia | H01L 29/40114 |

\* cited by examiner

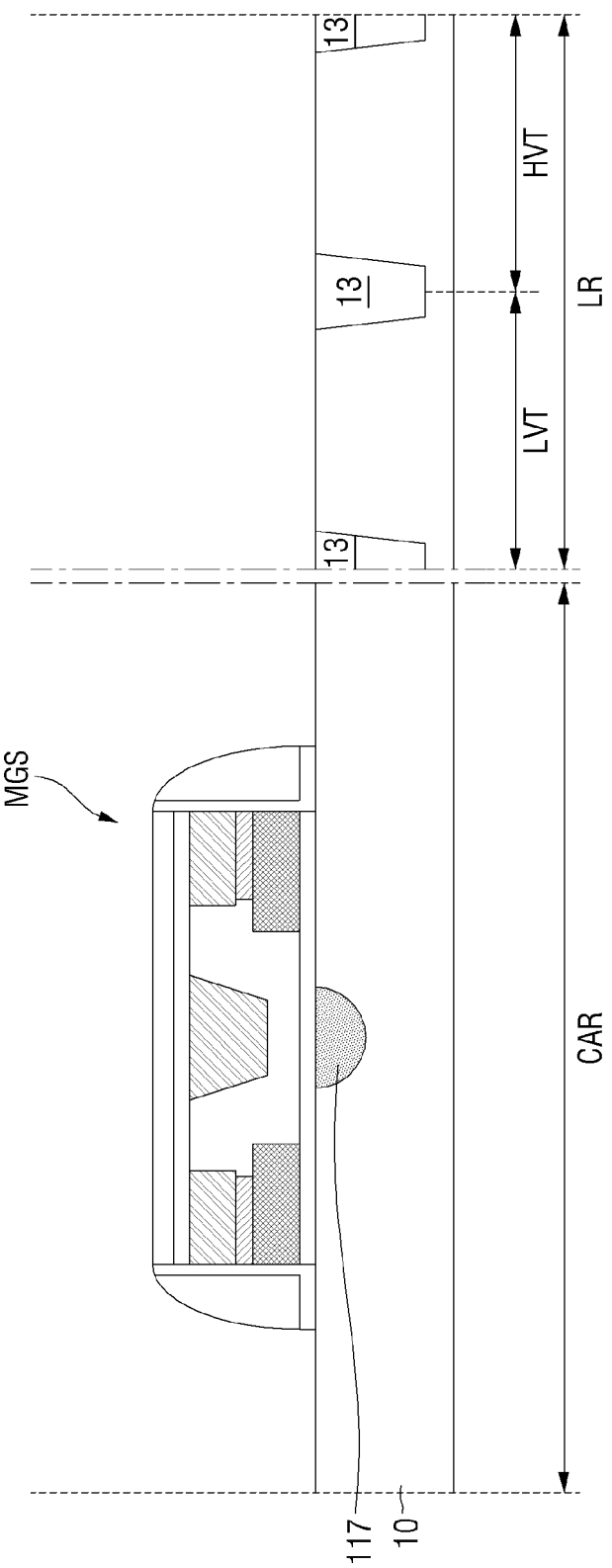

SEMICONDUCTOR DEVICE AND METHOD OF MANUFACTURING THE SAME

This application claims priority from Korean Patent Application No. 10-2021-0086200, filed on Jul. 1, 2021, in the Korean Intellectual Property Office, the disclosure of which is incorporated herein by reference in its entirety.

BACKGROUND

1. Field

Methods, apparatuses and systems consistent with example embodiments relate to a semiconductor device and a method of manufacturing the same.

2. Description of Related Art

In a related computing system structure, instructions (or programs) and data are stored in a memory device separated from a processor, and the instructions and the data must be transmitted to process the data based on the instructions. Therefore, even if the processing speed of the processor increases, the data transmission speed between the processor and the memory device acts as an obstacle to performance improvement, thereby limiting throughput of the computing system. To solve this problem, a memory-in-logic device in which a processor logic includes memory cells may be used, or a dedicated processor logic or the like may be used.

Accordingly, a memory-in-logic device that processes data such as voice, image, video, or text, which is target data of artificial intelligence, video/motion recognition, deep learning, machine learning, and the like, in units of one die or chip is used, or a dedicated processor logic is used.

However, in a method of manufacturing a semiconductor device including an embedded memory such as memory-in-logic, both a process for processor logic and a process for memory must be considered, which requires a complex multilayered device that is expensive and inefficient for manufacturing.

SUMMARY

One or more example embodiments provide a semiconductor device which prevents penetration due to a wet process by separating a high dielectric constant (high-k) film in a select transistor and improves durability through the penetration prevention.

One or more example embodiments provide a method of manufacturing a split gate-type semiconductor device, in which a process of generating a high-k film in a logic region and a process of generating a high-k film of a select transistor in a memory cell array region are shared to simplify the process.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of an example embodiment, there is provided a semiconductor device including: a floating gate disposed on a substrate; a memory gate disposed on the floating gate; a first spacer disposed on a sidewall of the floating gate, a sidewall of the memory gate and an upper surface of the substrate; a second spacer disposed on the first spacer; a select high dielectric constant (high-k) film disposed on a first portion of a sidewall of the first spacer between the substrate and the second spacer; and a select gate disposed on a second portion of the sidewall of the first spacer between the substrate and the second spacer. The upper surface of the substrate extends along a first direction and a second direction that crosses the first direction, a third direction is perpendicular to the upper surface of the substrate, a width of a portion of the first spacer in the first direction is reduced as a distance to the substrate decreases along the third direction, and the portion of the first spacer is disposed between the substrate and the second spacer.

According to an aspect of an example embodiment, there is provided a semiconductor device including: a floating gate disposed on a substrate in a first region; a memory gate disposed on the floating gate; a first spacer disposed on a sidewall of the floating gate, a sidewall of the memory gate and an upper surface of the substrate; a second spacer disposed on the first spacer; a first select high-k film disposed on the upper surface of the substrate and a first portion of a sidewall of the first spacer between the substrate and the second spacer; a first high-k film disposed on the substrate in a second region different from the first region; and a first gate disposed on the first high-k film. The upper surface of the substrate extends along a first direction and a second direction that crosses the first direction, a third direction is perpendicular to the upper surface of the substrate, a width of a portion of the first spacer in the first direction is reduced as a distance the substrate decreases along the third direction, the first spacer is disposed between the substrate and the second spacer, and the first high-k film and the first select high-k film include a common material.

According to an aspect of an example embodiment, there is provided a method of manufacturing a semiconductor device, the method including: providing a substrate which includes a first region and a second region different from the first region; forming a memory gate structure on the first region of the substrate, the memory gate structure including a floating gate, a memory gate, a first spacer formed along a sidewall of the floating gate, a sidewall of the memory gate and an upper surface of the substrate, and a second spacer disposed on the first spacer; forming an oxide layer on the substrate and the memory gate structure; etching a portion of the first spacer between the substrate and the second spacer, together with the oxide layer; forming a high-k layer on the substrate, wherein a portion of the high-k layer is disposed between the substrate and the second spacer along a sidewall of the first spacer; and forming a conductive layer such that a portion of the conductive layer is disposed on the high-k layer between the substrate and the second spacer. A width of a portion of the first spacer in a first direction is reduced as a distance to the substrate decreases.

According to an aspect of an example embodiment, there is provided a semiconductor device including: a tunnel insulating layer disposed on a substrate; a floating gate disposed on the tunnel insulating layer; a memory gate disposed on the floating gate; a first spacer disposed on a sidewall of the tunnel insulating layer, a sidewall of the floating gate, a sidewall of the memory gate and an upper surface of the substrate; a second spacer disposed on the first spacer; a high-k film disposed on a sidewall of the first spacer between the substrate and the second spacer; and a select gate disposed on a lower surface of the second spacer, the upper surface of the substrate and the sidewall of the first spacer. The sidewall of the first spacer is recessed toward the tunnel insulating layer and disposed between the substrate and the second spacer, and the high-k film includes TiN.

BRIEF DESCRIPTION OF THE DRAWINGS

These and/or other aspects, features, and advantages will become apparent and more readily appreciated from the following description, taken in conjunction with the accompanying drawings in which:

FIGS. 6 through 21, 22A, 22B and 23 through 25 are views illustrating a method of manufacturing a semiconductor device according to example embodiments.

DETAILED DESCRIPTION

Figure 1:
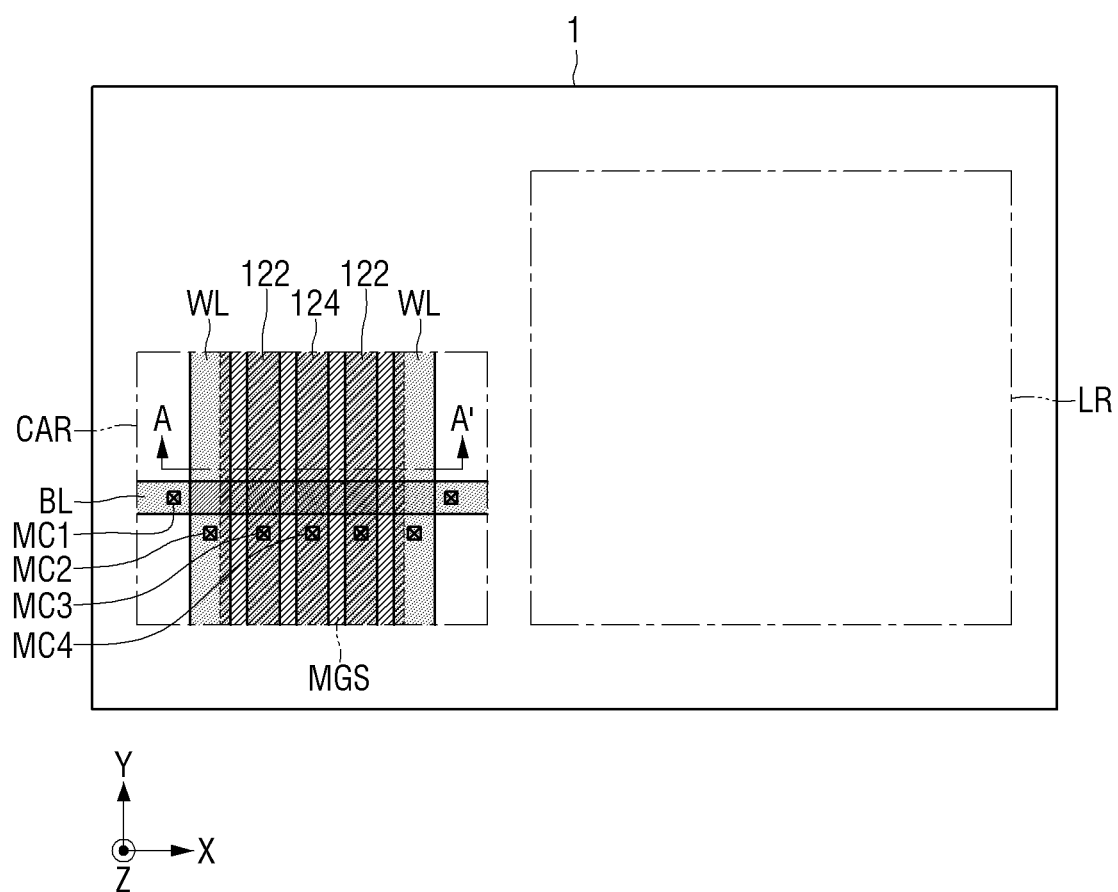
FIG. 1 is a plan view of a semiconductor device according to example embodiments.

Hereinafter, example embodiments will be described with reference to the accompanying drawings. In the description of FIGS. 1 through 25, substantially the same components are identified by the same reference characters, and any redundant description thereof will be omitted. In addition, similar components are identified by similar reference characters throughout the drawings. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2A:
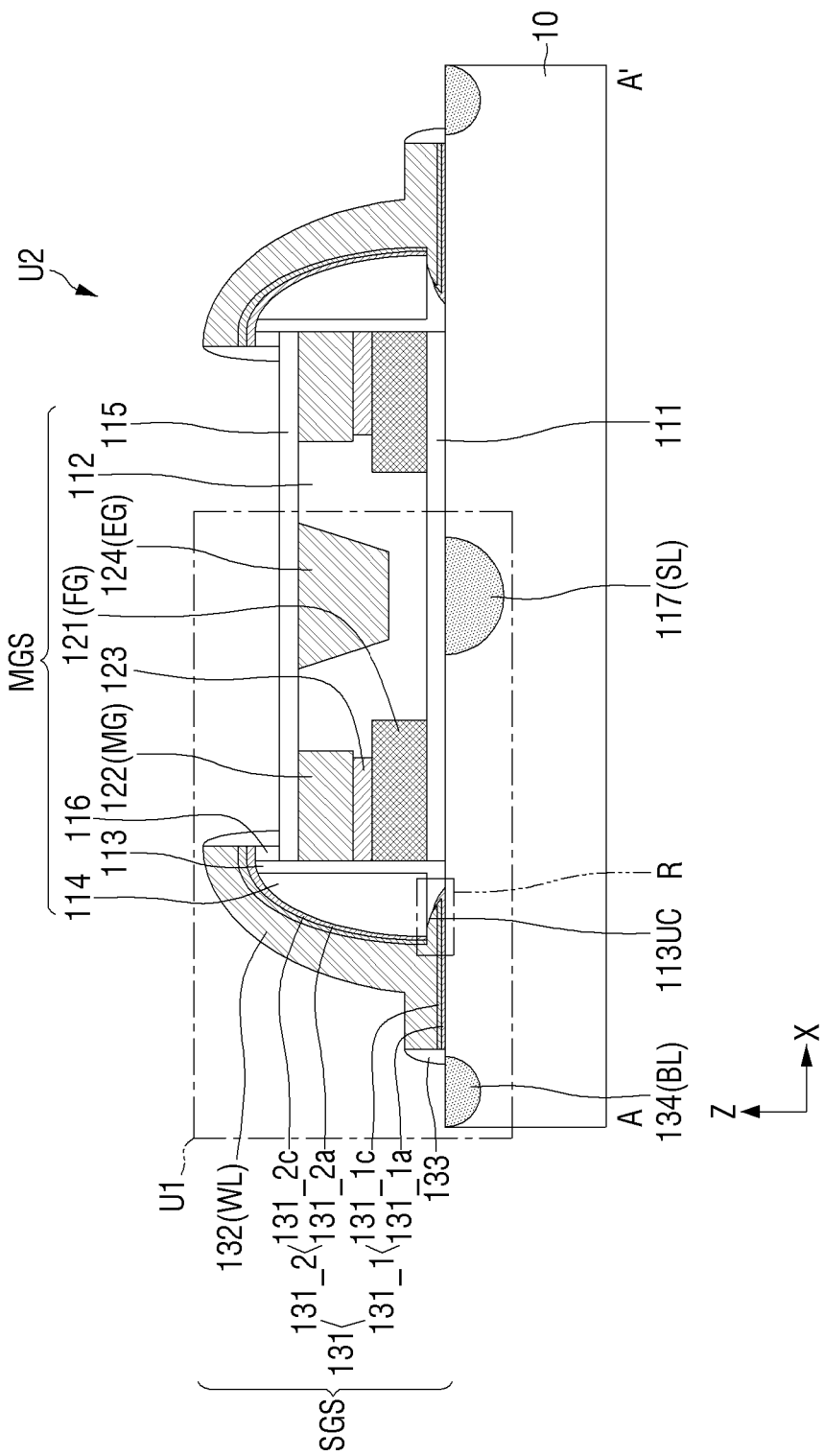
FIG. 2A is a cross-sectional view taken along line A-A' of FIG. 1.
Figure 3:
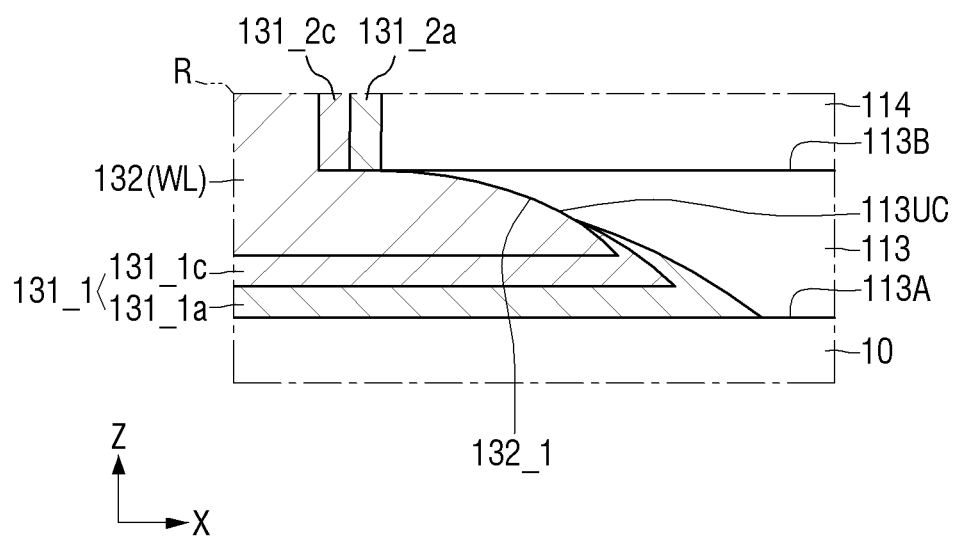
FIG. 3 is an enlarged view of area R of FIG. 2A.

FIG. 1 is a plan view of a semiconductor device 1 according to example embodiments. FIG. 2A is a cross-sectional view taken along line A-A' of FIG. 1. FIG. 3 is an enlarged view of area R of FIG. 2A.

Referring to FIGS. 1 through 3, the semiconductor device 1 may be implemented as a system-on-chip (SoC) in the form of a single chip. The semiconductor device 1 may include a processor logic which includes a neuromorphic processing unit, a graphics processing unit, central processing units (CPUs) and the like, and a memory in which data necessary for the operation of the processor logic can be stored.

The memory may include, for example, a non-volatile memory. The non-volatile memory may include a memory cell element, and the memory cell element of the non-volatile memory according to some example embodiments may include at least one split gate-type transistor.

The semiconductor device 1 may include a memory cell array region CAR and a logic region LR not overlapping each other in plan view. The memory may be disposed in the memory cell array region CAR, and the processor logic may be disposed in the logic region LR.

In the memory cell array region CAR, the semiconductor device 1 may include a substrate 10, a memory gate structure MGS, a select gate structure SGS, a first source/drain 117, a second source/drain 134, a bit line BL, and a word line WL.

The substrate 10 may be bulk silicon or silicon-on-insulator (SOI). Alternatively, the substrate 10 may be a silicon substrate or may include another material such as, but not limited to, silicon germanium, silicon germanium on insulator (SGOI), indium antimonide, lead telluride, indium arsenide, indium phosphide, gallium arsenide, or gallium antimonide.

The memory gate structure MGS extends along a second direction Y on the substrate 10 and is symmetrically formed with respect to an erase gate 124 extending in the second direction Y. For ease of description, one side of the memory gate structure MGS will be mainly described below, but the same description applies to the other side of the memory gate structure MGS.

The memory gate structure MGS may include a first tunnel insulating layer 111, a second tunnel insulating layer 112, a first spacer 113, a second spacer 114, a first capping pattern 115, a second capping pattern 116, a floating gate 121, a memory gate 122, a dielectric layer 123, and the erase gate 124.

Each component of the memory gate structure MGS may extend along the second direction Y, and the memory gate structure MGS may have a split gate structure in which the floating gate 121 and the memory gate 122 are disposed on both sides of the erase gate 124.

The first tunnel insulating layer 111 may be disposed on the substrate 10 and may include silicon oxide, but example embodiments are not limited thereto. The first tunnel insulating layer 111 may be formed by, for example, thermally oxidizing a surface of the substrate 10 in a thermal oxidation process.

The second tunnel insulating layer 112 may be disposed on the first tunnel insulating layer 111 and may be formed on a side of the floating gate 121, the memory gate 122, and the dielectric layer 123. The second tunnel insulating layer 112 may include silicon oxide, but example embodiments are not limited thereto. In particular, the second tunnel insulating layer 112 is disposed between the first source/drain 117 and the erase gate 124 to maintain a gap between the first source/drain 117 and the erase gate 124. A distance between the substrate 10 and the erase gate 124 is greater than a distance between the substrate 10 and the floating gate 121.

The floating gate 121 may be disposed on the first tunnel insulating layer 111 and may include polysilicon doped with impurities or a metal, but example embodiments are not limited thereto.

The dielectric layer 123 may be disposed between the floating gate 121 and the memory gate 122 and may include silicon oxide or silicon nitride. In an example embodiment, the dielectric layer 123 may have a multilayer structure in which an oxide layer, a nitride layer, and an oxide layer are sequentially stacked. The multilayer structure may increase a dielectric constant formed between the floating gate 121 and the memory gate 122.

The memory gate 122 may be connected to a memory gate line MG through a third contact MC3 and may be disposed on the dielectric layer 123 to have a floating gate electrode structure. Like the floating gate 121, the memory gate 122 may include polysilicon doped with impurities.

The first capping pattern 115 and the second capping pattern 116 may be sequentially disposed on the memory gate 122 and may include silicon oxide and silicon nitride, respectively.

The erase gate 124 may be connected to an erase gate line EG through a fourth contact MC4 and, like the floating gate 121, may include doped polysilicon.

The first spacer 113 may extend along the second direction Y and may be formed along an upper surface of the substrate 10, and a sidewall of the floating gate 121, a sidewall of the memory gate 122, a sidewall of the dielectric layer 123, a sidewall of the first capping pattern 115 and a sidewall of the second capping pattern 116.

The first spacer 113 includes a first region 113_1, and the first region 113_1 is disposed between the upper surface of the substrate 10 and a lower surface of the second spacer 114. A first surface 113A of the first region 113_1 extends in a direction opposite to a first direction X while in contact with the substrate 10, and a second surface 113B of a the first region 113_1 extends in the direction opposite to the first direction X while in contact with the second spacer 114. The second surface 113B protrudes further in the direction opposite to the first direction X than the first surface 113A. That is, a width of the first region 113_1 in the first direction X is reduced as the first region 113_1 is closer to the substrate 10.

An undercut sidewall 113UC of the first region 113_1 is disposed between the first surface 113A and the second surface 113B and connects the first surface 113A and the second surface 113B. The undercut sidewall 113UC is recessed toward the first tunnel insulating layer 111 and the floating gate 121.

The first spacer 113 may include silicon oxide. In an example embodiment, the first spacer 113 may have a thickness of hundreds of Å, in particular, a thickness of 300 to 400 Å.

The select gate structure SGS extends in the second direction Y and is symmetrically disposed on both sides of the memory gate structure MGS. At least a part of the select gate structure SGS overlaps the word line WL extending in the second direction Y in plan view, and the select gate structure SGS is electrically connected to the word line WL through a second contact MC2.

The select gate structure SGS includes a select high-dielectric constant (high-k) film 131, a select gate 132, and a third spacer 133. The select gate structure SGS may include a gate structure corresponding to a low-voltage transistor LVT which will be described later.

The select high-k film 131 includes a first select high-k film 131_1 and a second select high-k film 131_2.

The first select high-k film 131_1 is formed between the upper surface of the substrate 10 and the lower surface of the second spacer 114 along the upper surface of the substrate 10, and only a part of the undercut sidewall 113UC. Due to low step coverage of the first select high-k film 131_1, the first select high-k film 131_1 does not cover the entire undercut sidewall 113UC, and thus at least a part of the undercut sidewall 113UC is exposed to the select gate 132.

The second select high-k film 131_2 covers a sidewall of the second spacer 114 and is disposed between the select gate 132 and an upper surface of the second spacer 114. The first select high-k film 131_1 and the second select high-k film 131_2 are physically separated by the select gate 132.

The first select high-k film 131_1 includes a $(1\_1)^{th}$ select high-k film 131_1a and a $(1\_3)^{th}$ select high-k film 131_1c. The $(1\_1)^{th}$ select high-k film 131_1a is formed between the upper surface of the substrate 10 and the lower surface of the second spacer 114 along the upper surface of the substrate 10 and only a part of the undercut sidewall 113UC. The $(1\_1)^{th}$ select high-k film 131_1a may include at least one of, for example, hafnium oxide, zirconium oxide, hafnium zirconium oxide, barium strontium titanium oxide, barium titanium oxide, and lead zirconium titanium oxide.

The $(1\_3)^{th}$ select high-k film 131_1c is formed on the $(1\_1)^{th}$ select high-k film 131_1a along the upper surface of the $(1\_1)^{th}$ select high-k film 131_1a. The $(1\_3)^{th}$ select high-k film 131_1c may include, but is not limited to, at least one of lanthanum (La), titanium nitride (TIN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations of the same. A conductive metal oxide and a conductive metal oxynitride may include, but are not limited to, oxidized forms of the above materials.

The second select high-k film 131_2 includes a $(2\_1)^{th}$ select high-k film 131_2a and a $(2\_3)^{th}$ select high-k film 131_2c. The $(2\_1)^{th}$ select high-k film 131_2a covers the sidewall of the second spacer 114 and is disposed between the select gate 132 and the upper surface of the second spacer 114. The $(2\_1)^{th}$ select high-k film 131_2a is disposed between the sidewall of the second spacer 114 and the $(2\_3)^{th}$ select high-k film 131_2c. The $(2\_3)^{th}$ select high-k film 131_2c is formed on the $(2\_1)^{th}$ select high-k film 131_2a along the $(2\_1)^{th}$ select high-k film 131_2a.

The $(2\_1)^{th}$ select high-k film 131_2a and the $(2\_3)^{th}$ select high-k film 131_2c may correspond to the $(1\_1)^{th}$ select high-k film 131_1a and the $(1\_3)^{th}$ select high-k film 131_1c, respectively. A description of materials of the $(2\_1)^{th}$ select high-k film 131_2a and the $(2\_3)^{th}$ select high-k film 131_2c may be replaced with the description of the materials of the $(1\_1)^{th}$ select high-k film 131_1a and the $(1\_3)^{th}$ select high-k film 131_1c.

The select gate 132 is connected to the word line WL through the second contact MC2, covers the first spacer 113, the second spacer 114 and at least a part of the substrate 10, and is formed along an upper surface of the first spacer 113 and the upper surface of the second spacer 114. Furthermore, at least a part of the select gate 132 is recessed toward the undercut sidewall 113UC between the upper surface of the substrate 10 and the lower surface of the second spacer 114 to contact a part of the undercut sidewall 113UC and physically separate the first select high-k film 131_1 and the second select high-k film 131_2.

The select gate 132 may overlap and cover at least a part of the memory gate 122 in plan view, and the first capping pattern 115 and the second capping pattern 116 are disposed between the select gate 132 and the memory gate 122.

The select gate 132, like the floating gate 121, may include polysilicon doped with impurities and may have a greater chemical resistance to phosphoric acid ($H_3PO_4$) than the select high-k film 131.

The third spacer 133 may be disposed on the substrate 10, the second source/drain 134, and the memory gate structure MGS. The third spacer 133 may be disposed on a sidewall of the select high-k film 131 and a sidewall of the select gate 132 and may include silicon nitride. The third spacer 133 may also be disposed on the first capping pattern 115 and another sidewall of the select gate 132, and a sidewall of the second select high-k film 131_2.

The first source/drain 117 formed in the upper surface of the substrate 10 at a predetermined depth, doped with impurities, and may be disposed between the memory gate structure MGS and the substrate 10. The first source/drain 117 may provide a source region and may be electrically connected to a source line SL.

The second source/drain 134 doped with impurities may be disposed in a part of the substrate 10 which is adjacent to the select gate structure SGS. The second source/drain 134 intersects the memory gate structure MGS in plan view and is electrically connected to the bit line BL extending in the first direction X through a first contact MC1.

Figure 2B:
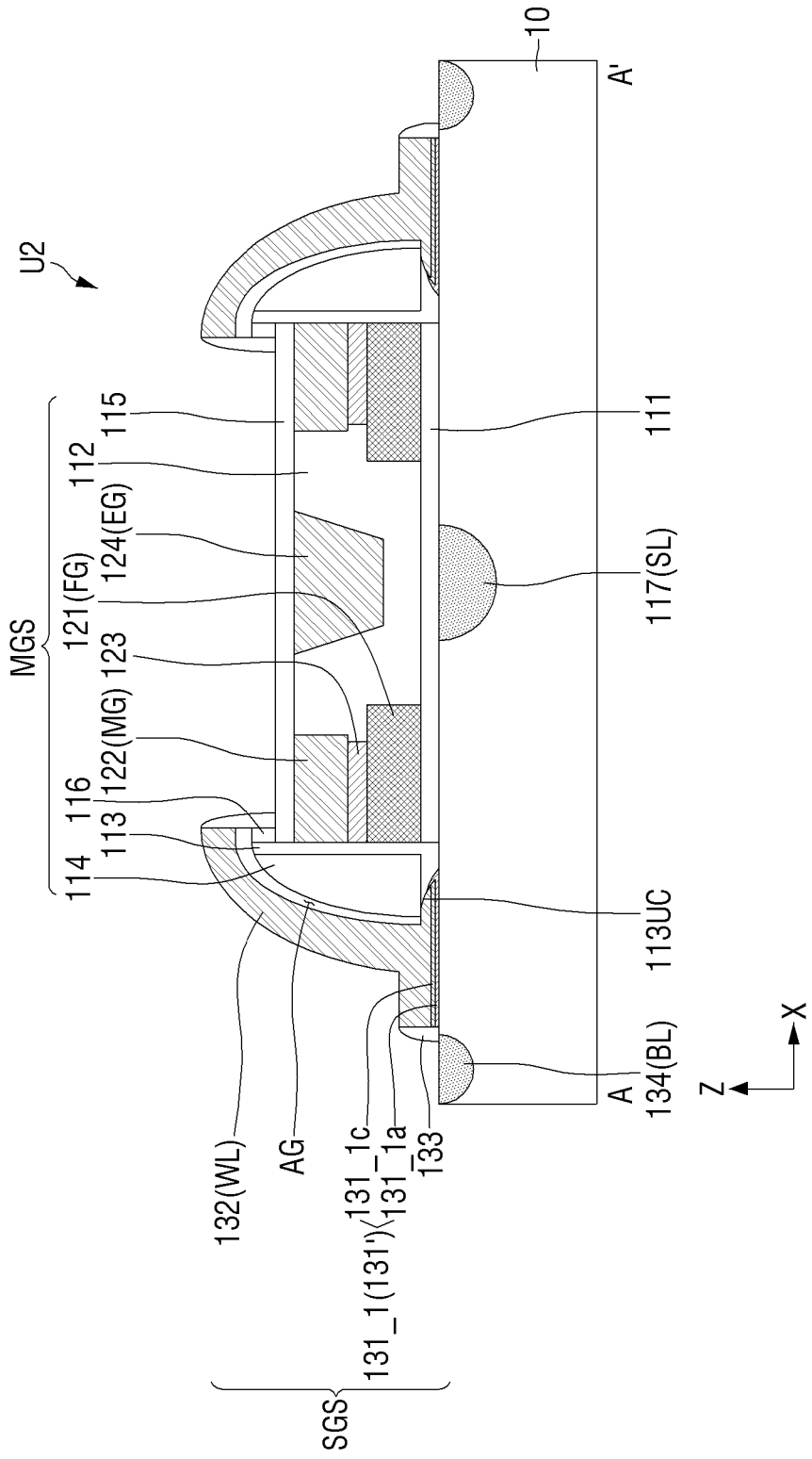
FIG. 2B is a view illustrating a semiconductor device according to example embodiments.

FIG. 2B illustrates a semiconductor device according to example embodiments. The semiconductor device according to example embodiments will now be described with reference to FIG. 2B, focusing mainly on differences from the semiconductor device illustrated in FIG. 2A.

Unlike the select high-k film 131 of FIG. 2A, a select high-k film 131' does not include a second select high-k film 131_2 and includes only a first select high-k film 131_1.

An air gap AG is disposed in a space, in which the second select high-k film 131_2 of FIG. 2A used to be disposed, between a select gate 132 and an upper surface of a second spacer 114.

Figure 4:
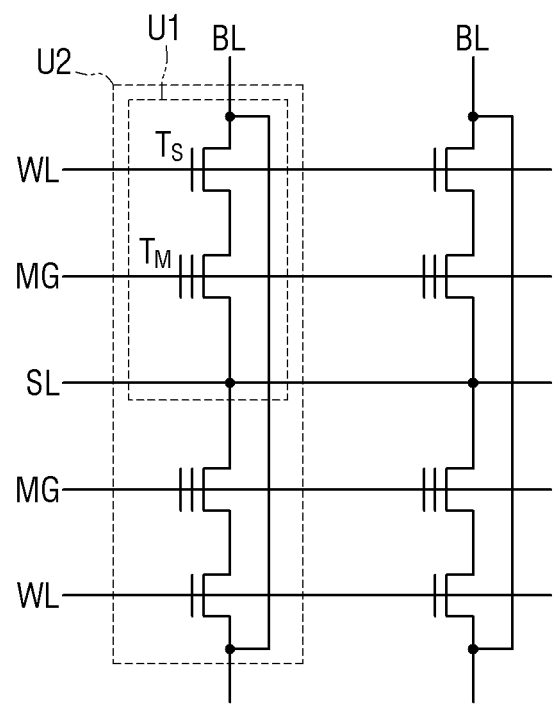
FIG. 4 is a circuit diagram illustrating unit memory cell elements that may be included in a memory cell array region according to example embodiments.

FIG. 4 is a circuit diagram illustrating unit memory cell elements U1 and U2 that may be included in the memory cell array region CAR according to example embodiments.

Referring to FIGS. 2A and 4, the memory of the semiconductor device 1 may include a plurality of unit memory cell elements U1. Each of the unit memory cell elements U1 may include one select transistor $T_S$ and one memory transistor $T_M$. A gate of the select transistor $T_S$ may correspond to the select gate structure SGS of FIG. 2A. The memory transistor $T_M$ may include a floating gate 121 and a memory gate 122, and a gate of the memory transistor $T_M$ may correspond to the memory gate structure MGS of FIG. 2A. Two neighboring unit memory cells U2 may be symmetrically arranged to share one source line SL. The non-volatile memory device of FIG. 2A is a cross-sectional view of two neighboring unit memory cells U2 which share one source line SL.

Figure 5A:
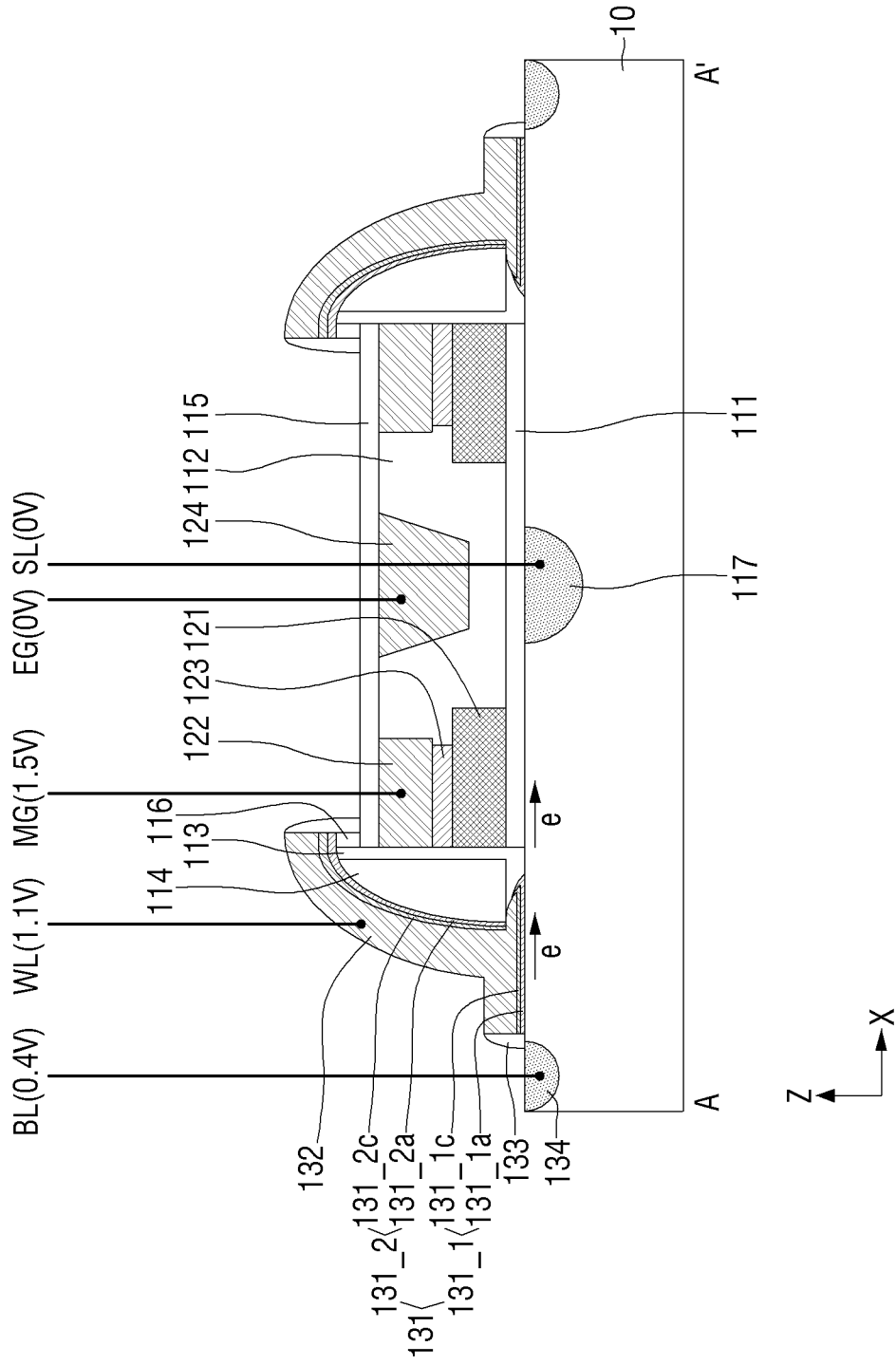
FIGS. 5A, 5B and 5C are views illustrating charge movement during operation of a unit memory cell element according to example embodiments.
Figure 5B:
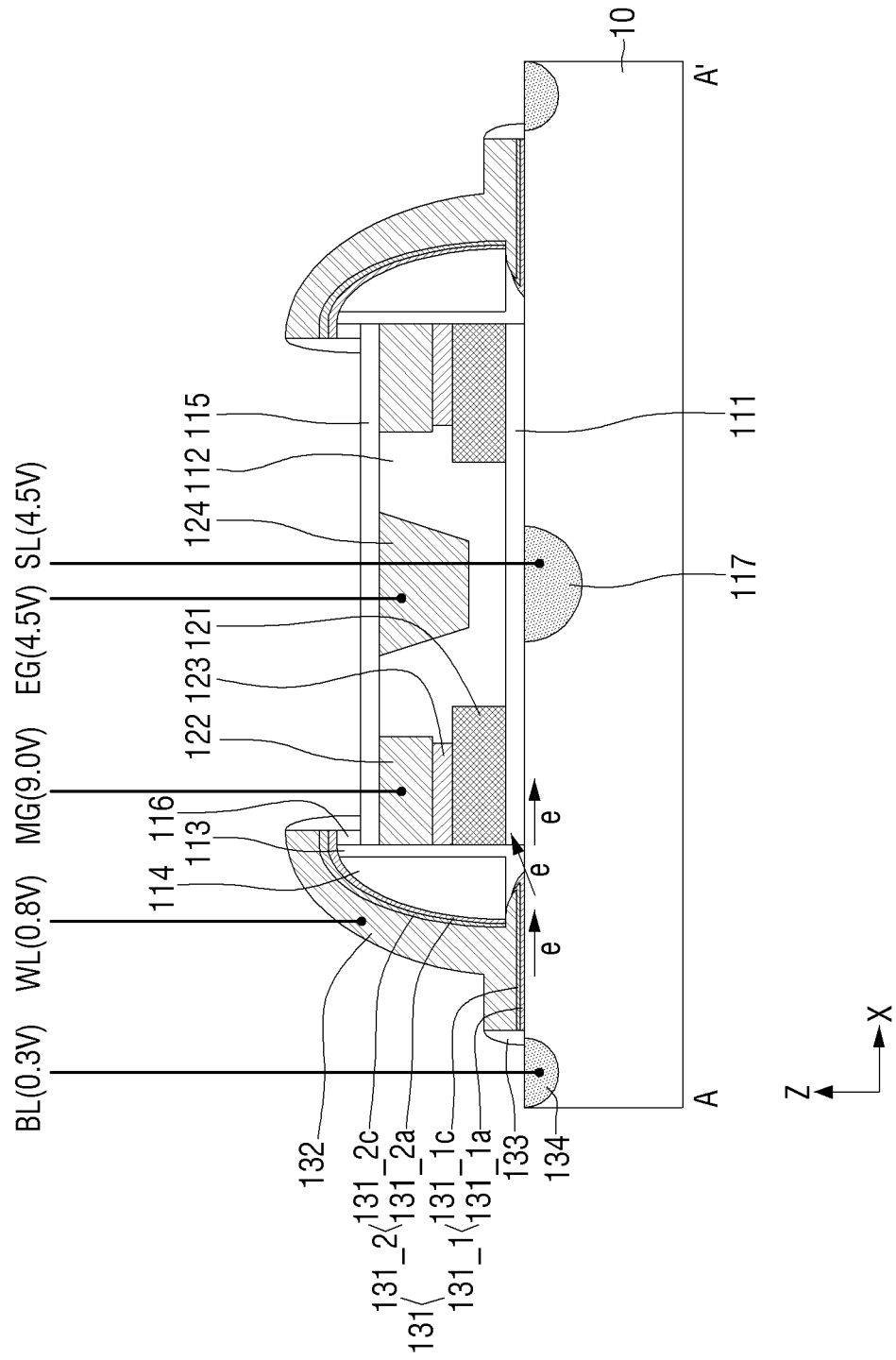
Figure 5C:
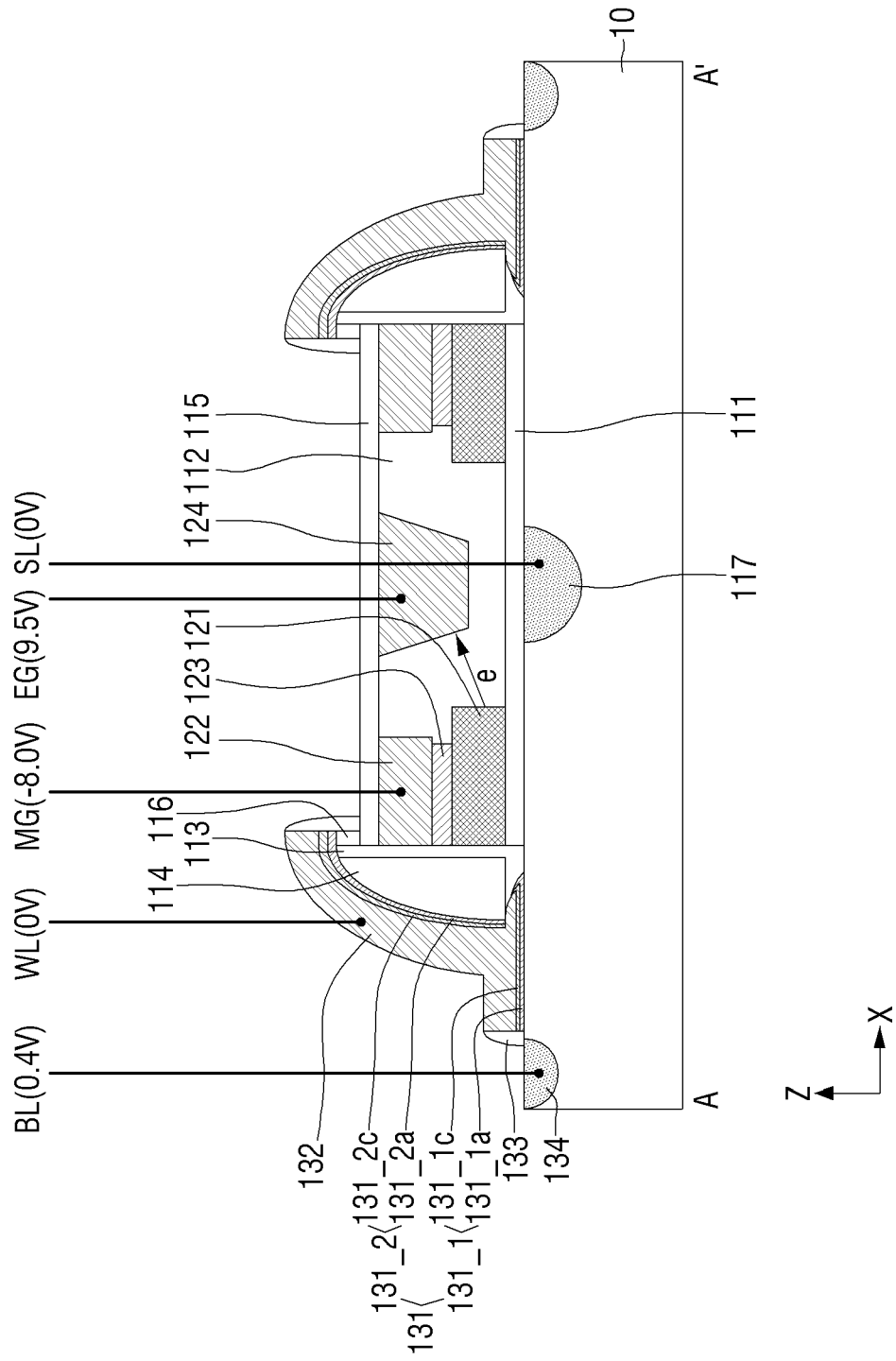

FIGS. 5A through 5C are cross-sectional views illustrating charge movement during operation of a unit memory cell element according to example embodiments. FIG. 5A illustrates charge movement during a read operation of the unit memory element. FIG. 5B illustrates charge movement during a write operation of the unit memory element. FIG. 5C illustrates charge movement during an erase operation of the unit memory element.

In the memory of the semiconductor device 1 according to example embodiments, voltage application during element operations may be, for example, as shown in Table 1.

TABLE 1

| Operation | | WL | MG | EG | BL | SL |
|---|---|---|---|---|---|---|
| Read | SELECT | 1.1 V | 1.5 V | 0 V | 0.4 V | 0 V |
| | UNSELECT | 0 V | 1.5 V | 0 V | 0 V | Float |
| Write | SELECT | 0.8 V | 9.0 V | 4.5 V | 0.3 V | 4.5 V |
| | UNSELECT | 0 V | 0 V | 0 V | 1.1 V | VDD/3 |
| Erase | SELECT | 0 V | −8.0 V | 9.5 V | 0 V | 0 V |
| | UNSELECT | 0 V | 1.1 V | 0 V | 0 V | 0 V |

FIG. 5A illustrates charge movement during a read operation of a unit memory element.

Referring to FIG. 5A and Table 1, a voltage (e.g., 1.1 V) sufficient to form a channel in the substrate 10 under a selected word line WL is applied to the word line WL. For example, 1.5 V, 0.4 V, and 0 V are applied to the memory gate line MG, the bit line BL, and the source line SL, respectively. Here, the flow of charges e is the same as the direction of arrows. The formation of a channel under the floating gate 121 may be determined according to whether charges are stored in the floating gate 121, and whether the unit memory element is programmed may be recognized by sensing the formation of the channel. On the other hand, 0 V may be applied to all of word lines, memory gate lines, source lines, and bit lines of unselected unit memory elements.

FIG. 5B illustrates charge movement during a write operation of the unit memory element.

Referring to FIG. 5B and Table 1, the write operation may be executed on a bit-by-bit basis. First, a voltage of about 9.0 V may be applied to the memory gate 122 to provide coupling to the floating gate 121 located under the memory gate 122, thereby moving the charges e as indicated by arrows. In addition, a voltage of 4.5 V corresponding to half of 9.0 V may be applied to the source line SL and the erase gate 124. A voltage of about 0.8 V may be applied to the word line WL, and a voltage of about 0.3 V or less may be applied to the bit line BL. Accordingly, a current of several microamperes may flow through the bit line BL.

FIG. 5C illustrates charge movement during an erase operation of the unit memory element.

Referring to FIG. 5C and Table 1, during the erase operation, a voltage of about 9.5 V may be applied to the erase gate 124 of a memory cell element U1 selected to erase data. Here, a negative (−) voltage of −8.0 V may be applied to the memory gate 122. Therefore, electron tunneling may occur from a floating gate electrode located under the memory gate 122 to the erase gate 124. Accordingly, the charges e may move in the direction of an arrow.

FIGS. 6 through 25 are views illustrating steps of a method of manufacturing a semiconductor device according to example embodiments. FIGS. 11, 13, 15, 17, 19 and 21 are enlarged views of area R of FIGS. 10, 12, 14, 16, 18 and 20, respectively.

Referring to FIGS. 2A, 2B and 6, a memory gate structure MGS may be formed on a substrate 10 in a memory cell array region CAR, and a plurality of element isolation layers 13 may be formed in the substrate 10 in a logic region LR. A first source/drain 117 may be disposed between the memory gate structure MGS and the substrate 10.

The element isolation layers 13 divide the logic region LR into a high-voltage transistor region HVT and a low-voltage transistor region LVT. The element isolation layers 13 may be formed in the shape of a plurality of lines crossing the substrate 10.

Figure 7:
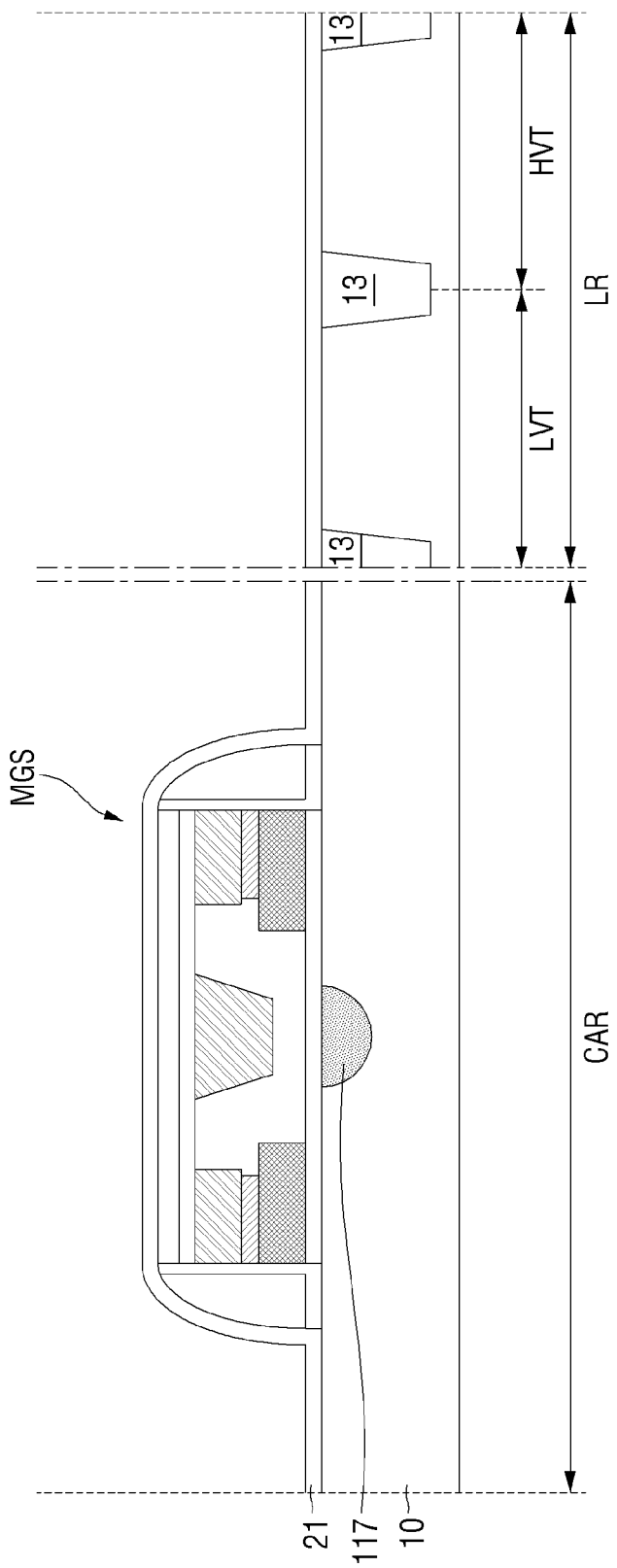

Referring additionally to FIG. 7, an oxide layer 21 is formed to cover the entire surface of the substrate 10 including the memory cell array region CAR and the logic region LR and the memory gate structure MGS. The oxide layer 21 may contact sidewalls of first spacers 113 and second spacers 114. The oxide layer 21 may include silicon oxide.

Figure 8:
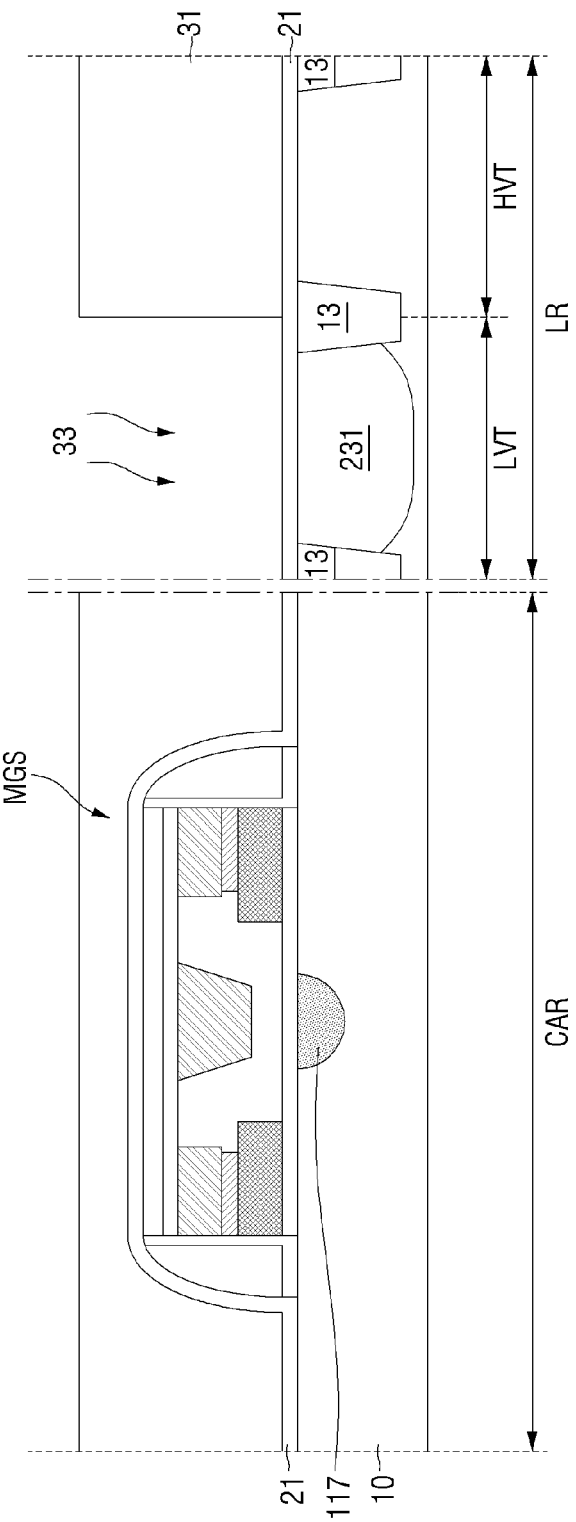

Referring additionally to FIG. 8, a first photoresist pattern 31 is formed on the substrate 10 to expose the low-voltage transistor region LVT, and cover the memory cell array region CAR and the high-voltage transistor region HVT. In addition, a low-voltage well region 231 is formed by implanting impurity ions 33 using the first photoresist pattern 31 as an ion implantation mask.

Figure 9:
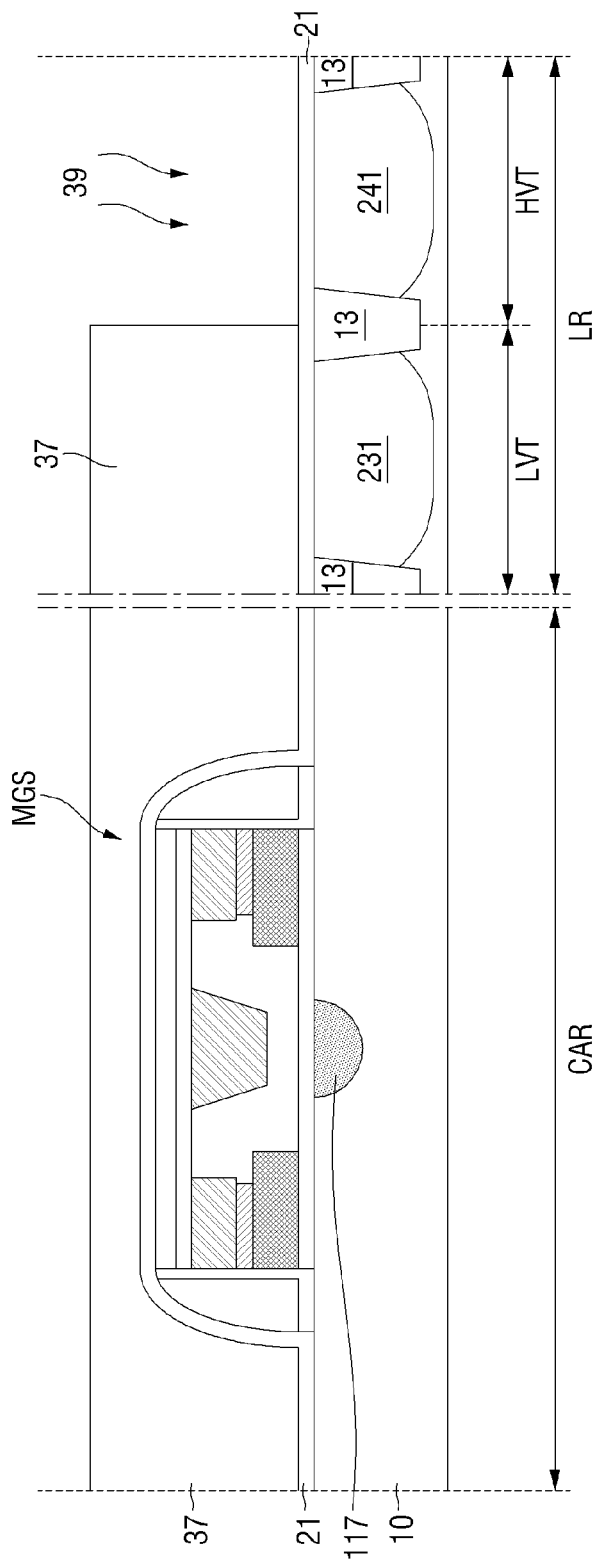

Referring additionally to FIG. 9, the first photoresist pattern 31 is removed. In addition, a second photoresist pattern 37 is formed on the substrate 10 to expose the high-voltage transistor region HVT, and to cover the low-voltage transistor region LVT and the memory cell array region CAR. Further, a high-voltage well region 241 is formed by implanting impurity ions 39 using the second photoresist pattern 37 as an ion implantation mask. The first and second spacers 113 and 114 may prevent memory gates 122, dielectric layers 123, floating gates 121 under the dielectric layers 123, and a first tunnel insulating layer 111 under the floating gates 121 illustrated in FIGS. 2A and 2B from being damaged during the formation and removal of the first and second photoresist patterns 31 and 37.

Figure 10:
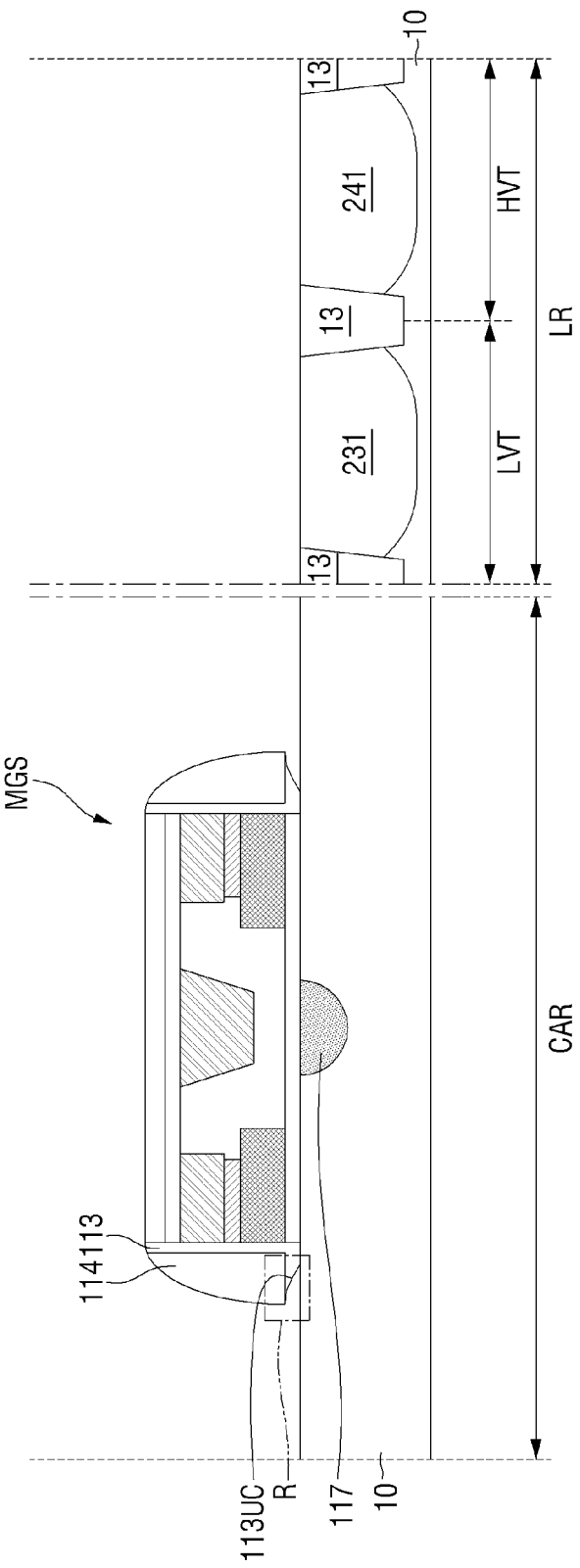
Figure 11:
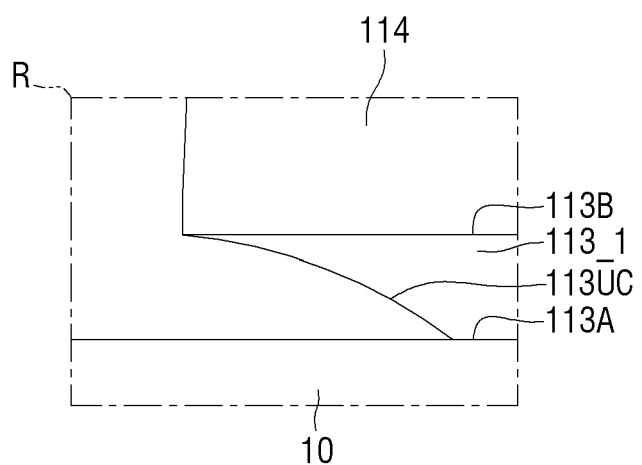

Referring additionally to FIGS. 10 and 11, the second photoresist pattern 37 is removed. In addition, the oxide layer 21 is removed using a wet etching process, and at least a part of each first spacer 113 is removed together with the oxide layer 21 to form an undercut sidewall 113UC of a first region 113_1 between the second spacer 114 and the substrate 10. Through the wet etching process, the first region 113_1 of each first spacer 113 has a sidewall in the shape of the undercut sidewall 113UC.

In the above wet etching process, the oxide layer 21 and a part of each first spacer 113 are etched using at least one of a hydrogen fluoride (HF) solution and a buffered oxide etch (BOE) solution.

Figure 12:
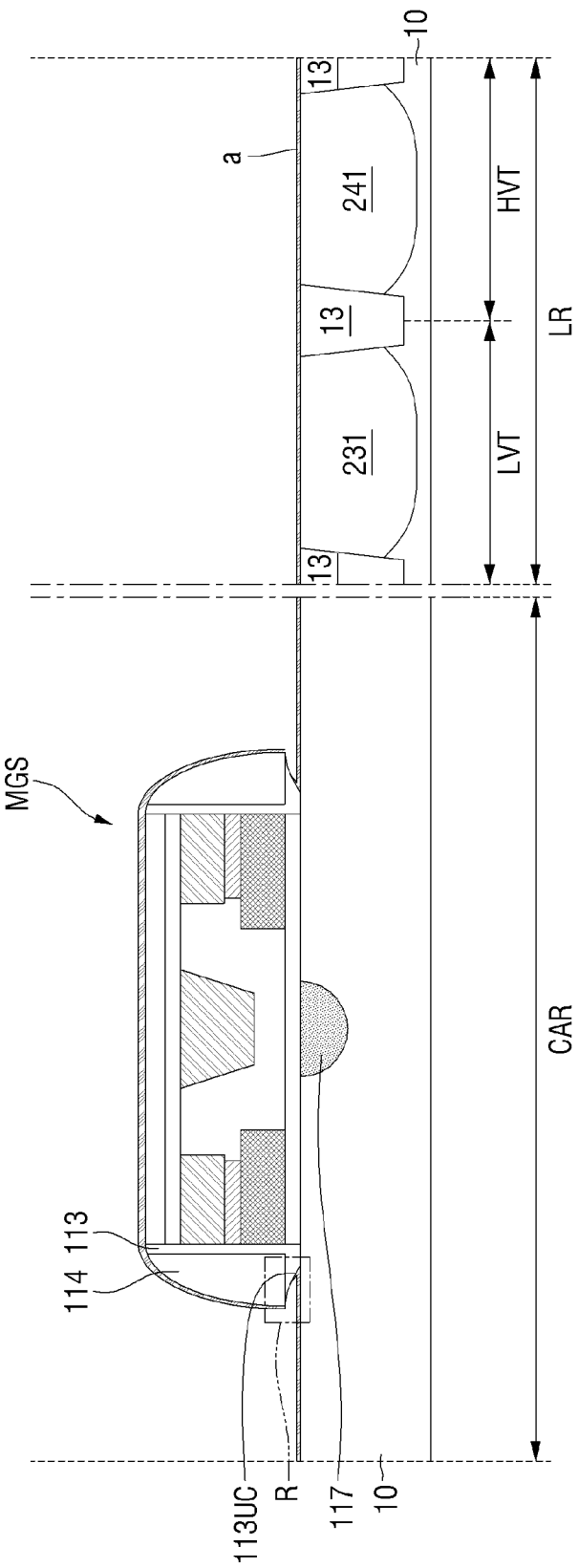
Figure 13:
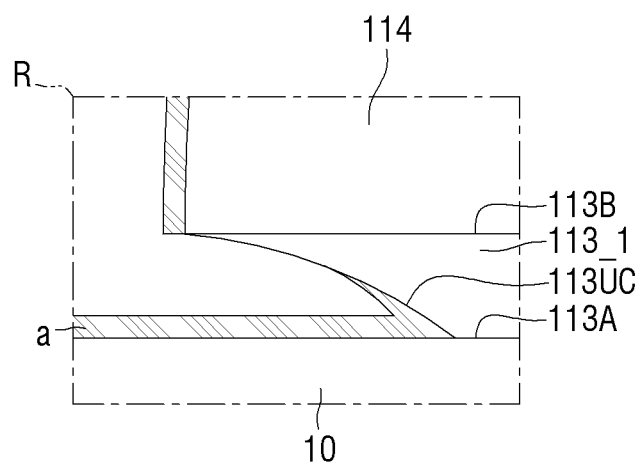

Referring additionally to FIGS. 12 and 13, a first high-k layer a is formed to cover the entire surface (CAR and LR) of the substrate 10 and an upper surface of the memory gate structure MGS and cover only a part of the undercut sidewall 113UC. The first high-k layer a may be formed through a method such as, but not limited to, atomic layer deposition (ALD), chemical vapor deposition (CVD), physical vapor deposition (PVD), or pulsed laser deposition (PLD).

The first high-k layer a may correspond to the $(1\_1)^{th}$ select high-k films 131_1a described above and may include the same material as the $(1\_1)^{th}$ select high-k films 131_1a. Due to the recessed structure of the undercut sidewall 113UC and the low step coverage of the first high-k layer a, the first high-k layer a covering only a part of the undercut sidewall 113UC and formed along the undercut sidewall 113UC becomes thinner in the third direction Z along the first direction X. An insulating layer may be formed by thermally oxidizing the surface of the substrate 10 before the stacking of the first high-k layer a.

Figure 14:
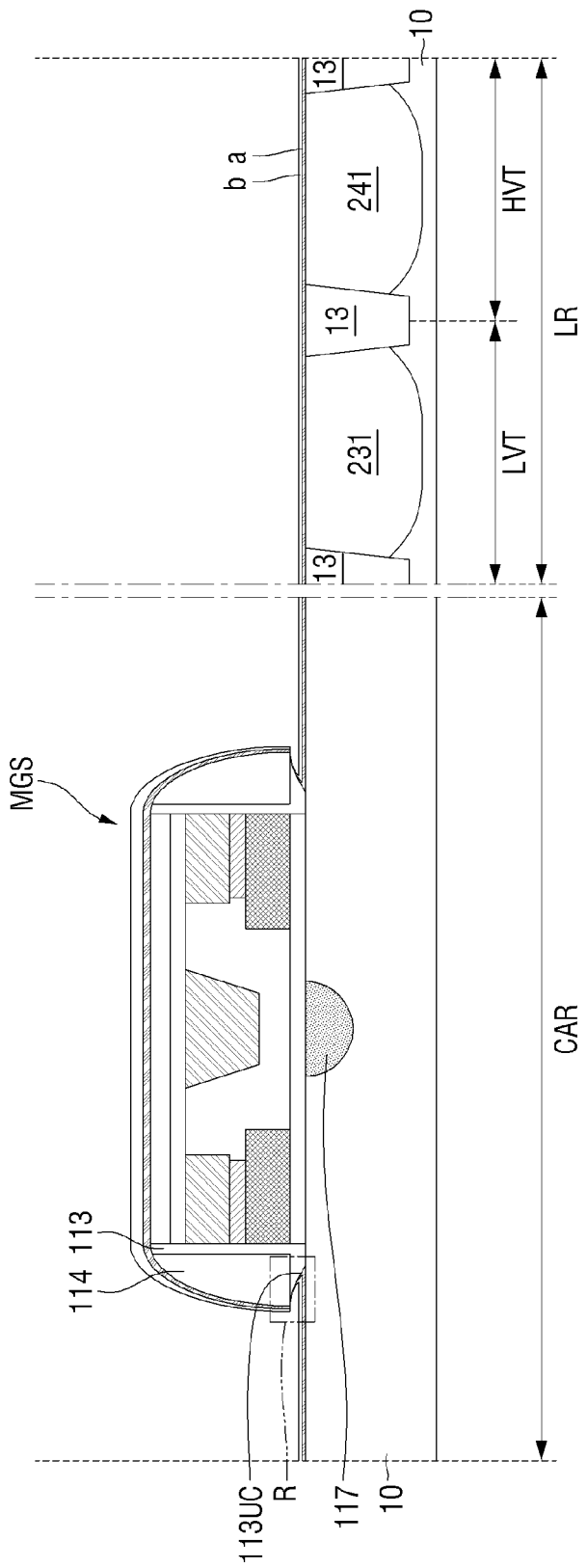
Figure 15:
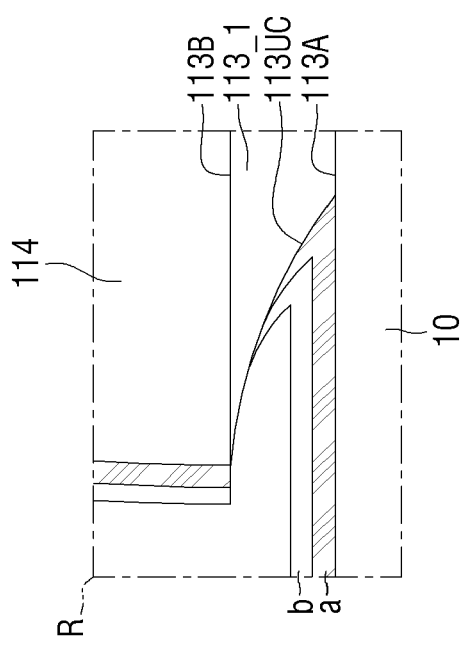

Referring additionally to FIGS. 14 and 15, a second high-k layer b is formed along an upper surface of the first high-k layer a. The second high-k layer b may be formed through a method such as, but not limited to, ALD, CVD, PVD, or PLD.

The second high-k layer b may include at least one of titanium (Ti), titanium nitride (TiN), tantalum carbide (TaC), and aluminum (Al). Due to the recessed structure of the undercut sidewall 113UC and the low step coverage of the second high-k layer b, the second high-k layer b covering only a part of the undercut sidewall 113UC and formed along the undercut sidewall 113UC becomes thinner in the third direction Z along the first direction X.

Figure 16:
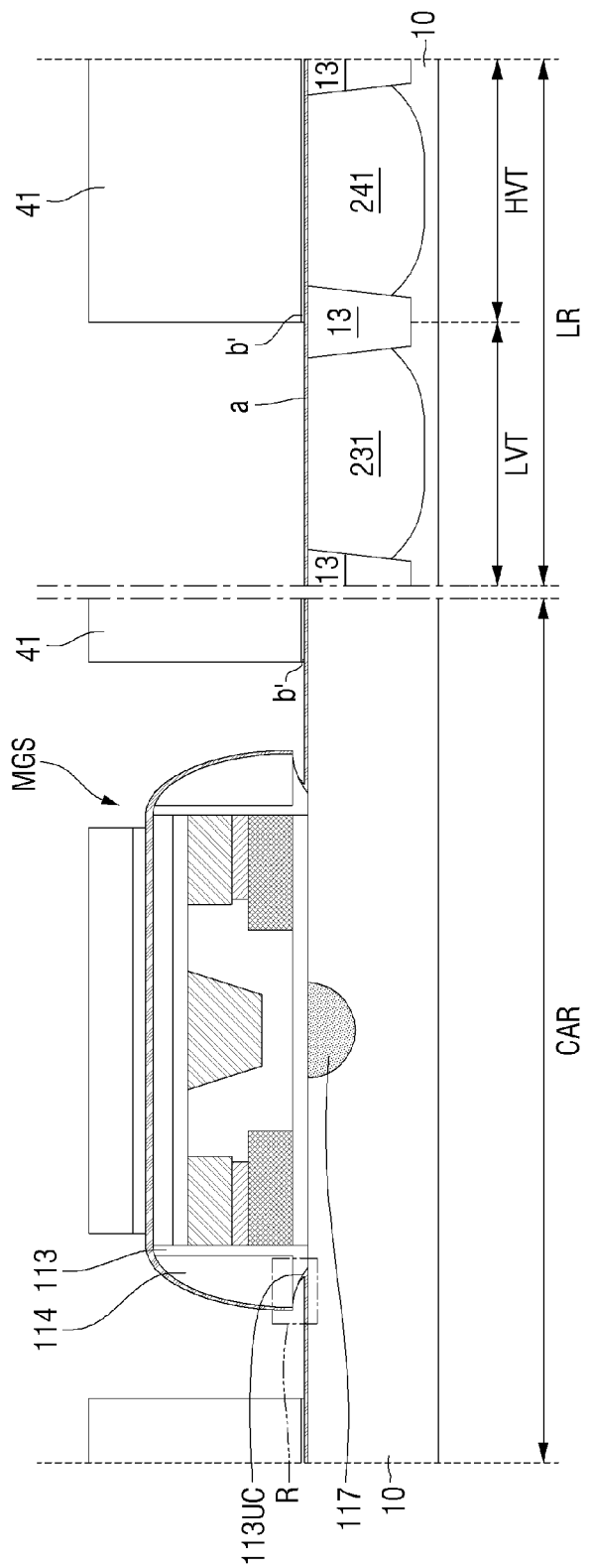
Figure 17:
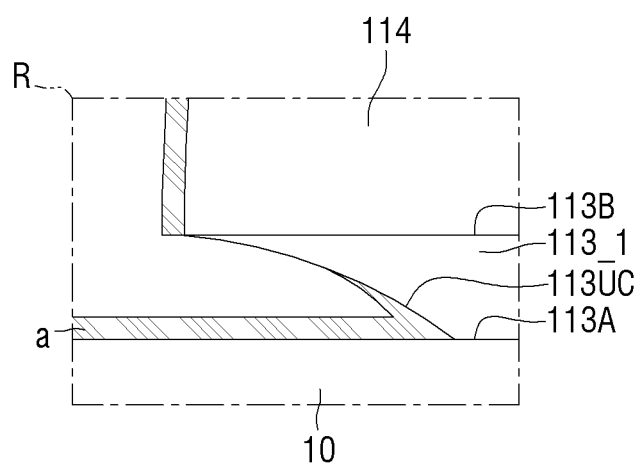

Referring additionally to FIGS. 16 and 17, a third photoresist pattern 41 is formed on the substrate 10 to expose the low-voltage transistor region LVT and positions where select gate structures SGS are to be formed, and to cover the memory cell array region CAR and the high-voltage transistor region HVT. In addition, the second high-k layer b is removed using the third photoresist pattern 41 as an etch mask to expose the first high-k layer a in the low-voltage transistor region LVT and at the positions where the select gate structures SGS are to be formed.

Figure 18:
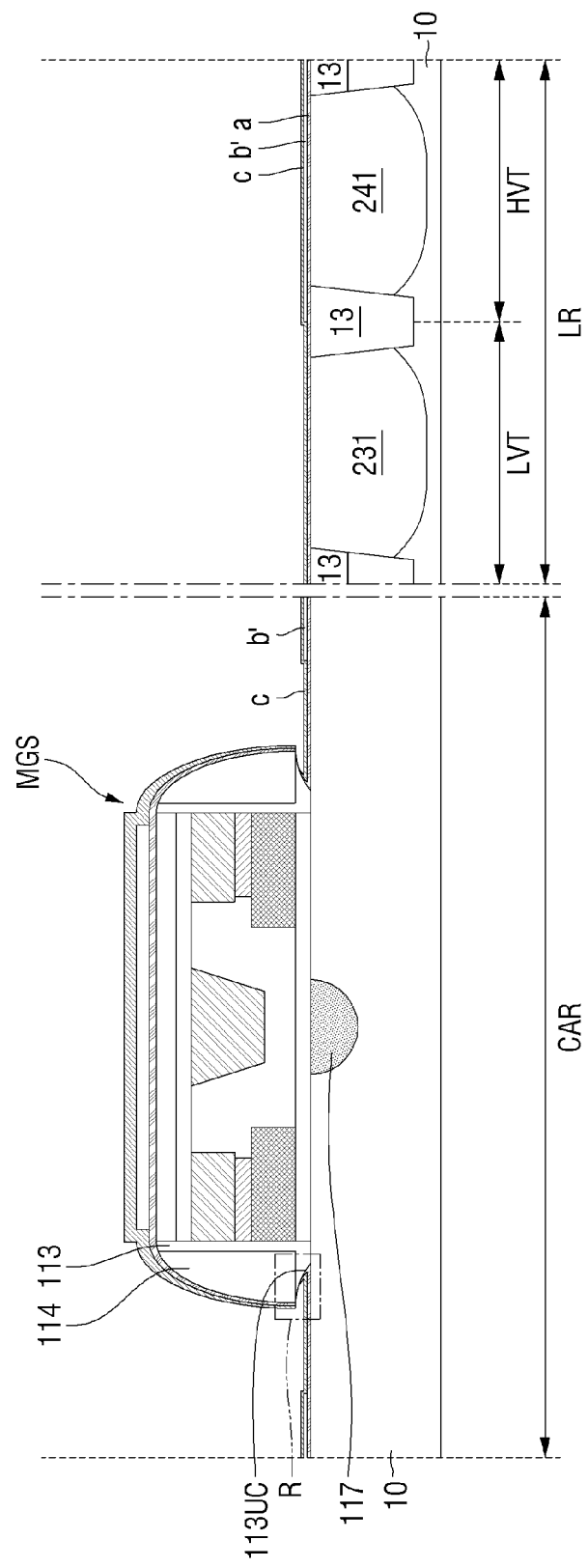
Figure 19:
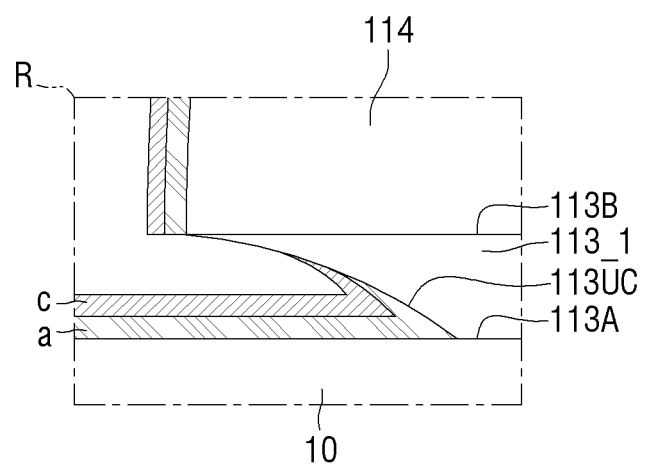

Referring additionally to FIGS. 18 and 19, after the third photoresist pattern 41 is removed, a third high-k layer c is formed along upper surfaces of the first high-k layer a and the second high-k layer b'. The third high-k layer c may be formed through a method such as, but not limited to, ALD, CVD, PVD, or PLD.

The third high-k layer c may correspond to the $(1\_3)^{th}$ select high-k films 131_1c described above and may include the same material as the $(1\_3)^{th}$ select high-k films 131_1c. Due to the recessed structure of the undercut sidewall 113UC and the low step coverage of the third high-k layer c, the third high-k layer c covering only a part of the undercut sidewall 113UC and formed along the undercut sidewall 113UC becomes thinner in the third direction Z along the first direction X.

Figure 20:
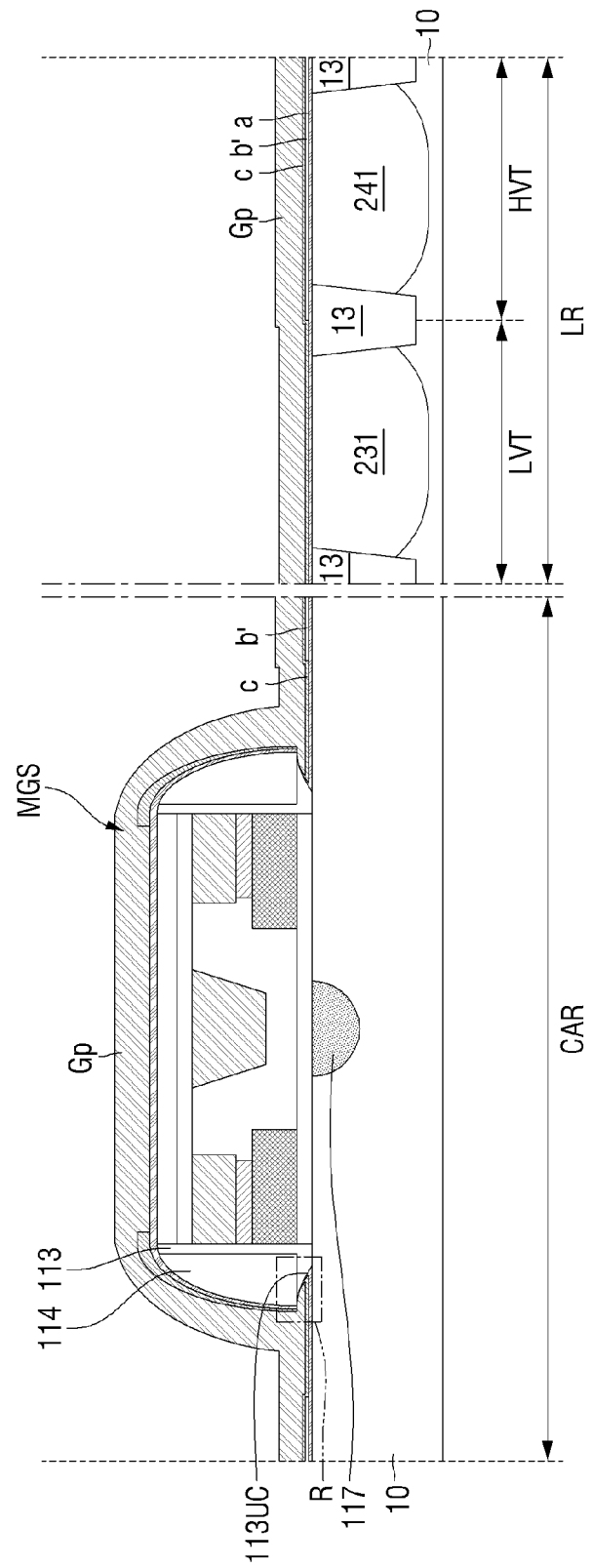
Figure 21:
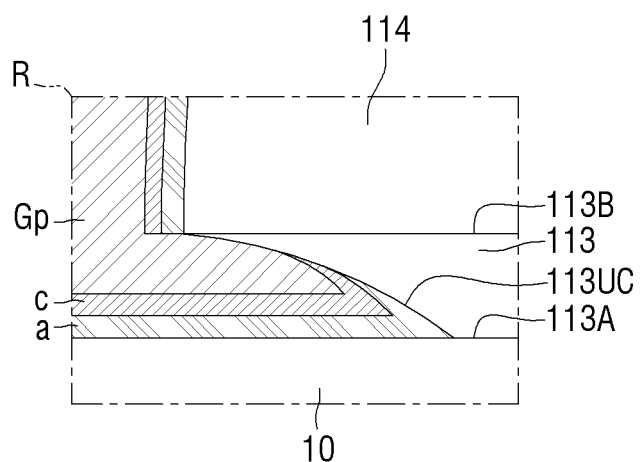

Referring additionally to FIGS. 20 and 21, a conductive layer Gp is formed on the substrate 10. For example, the conductive layer Gp may cover the entire surface of the substrate 10. The conductive layer Gp may be formed by, for example, depositing a polysilicon layer undoped with impurities and then performing an ion implantation process to dope the polysilicon layer with impurities, but example embodiments are not limited thereto.

At least a part of the conductive layer Gp may contact the undercut sidewall 113UC, and may be recessed toward the undercut sidewall 113UC between a lower surface of each second spacer 114 and an upper surface of the substrate 10.

Figure 22A:
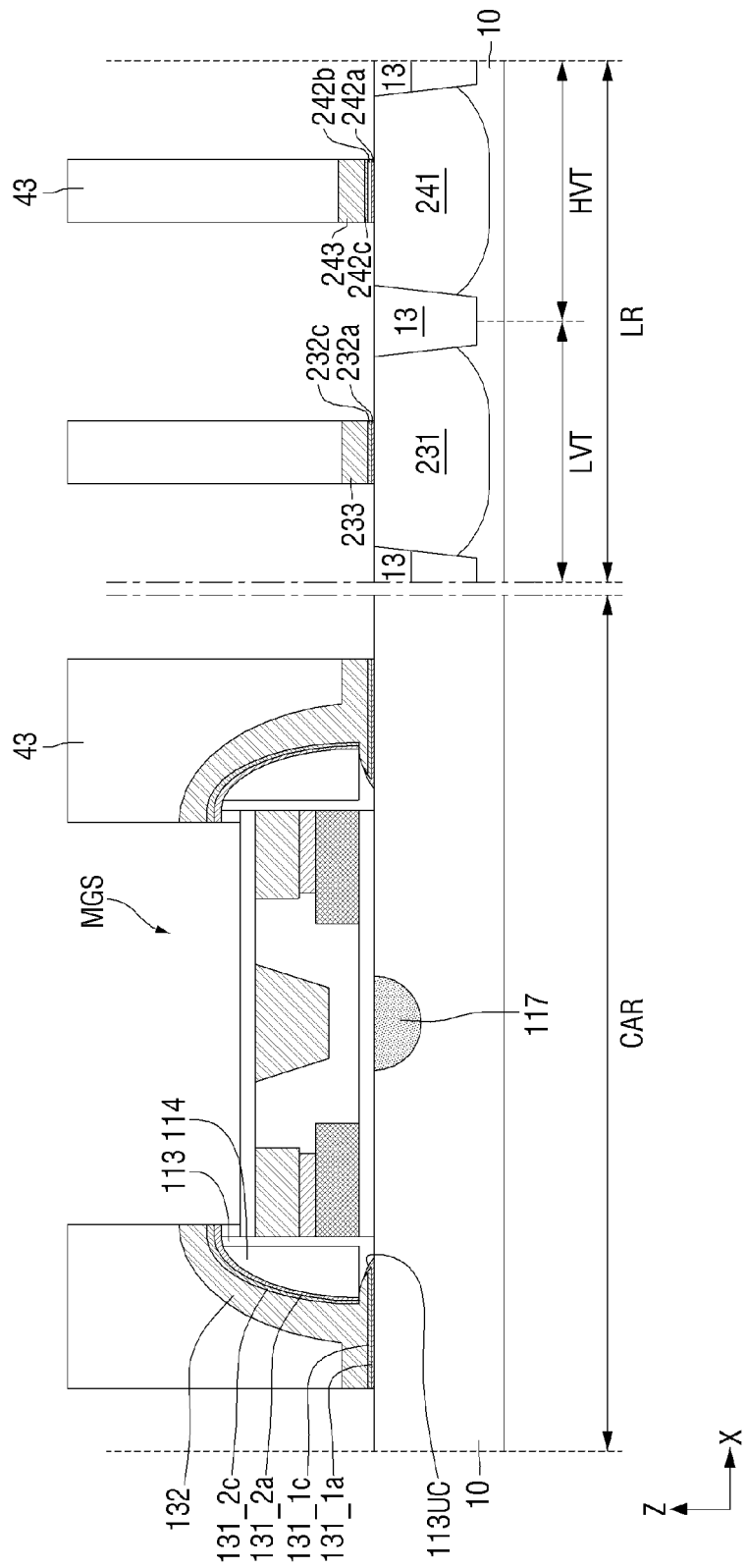

Referring additionally to FIG. 22A, fourth photoresist patterns 43 respectively defining select gates 132, a low-voltage gate electrode 233, and a high-voltage gate electrode 243 are formed on the conductive layer Gp. Then, the conductive layer Gp and the first through third high-k layers a, b' and c are partially etched using the fourth photoresist patterns 43 as an etch mask to form the select gates 132, the low-voltage gate electrode 233, and the high-voltage gate electrode 243 in the memory cell array region CAR, the low-voltage transistor region LVT, and the high-voltage transistor region HVT.

In addition to the select gates 132, the low-voltage gate electrode 233, and the high-voltage gate electrode 243, $(1\_1)^{th}$ select high-k films 131_1a, $(1\_3)^{th}$ select high-k films 131_1c, $(2\_1)^{th}$ select high-k films 131_2a, $(2\_3)^{th}$ select high-k films 131_2c, a first low-voltage high-k film 232a, a third low-voltage high-k film 232c, and first through third high-voltage high-k films 242a through 242c are formed. A part of each second capping pattern 116 is etched to expose sidewalls of a $(2\_1)^{th}$ select high-k film 131_2a and a $(2\_3)^{th}$ select high-k film 131_2c.

In particular, considering the processes in FIGS. 12 through 21, it is apparent that a thickness of the $(1\_1)^{th}$ select high-k films 131_1a and a thickness of the $(1\_3)^{th}$ select high-k films 131_1c in the third direction Z are the same as a thickness of the first low-voltage high-k film 232a and a thickness of the third low-voltage high-k film 232c in the third direction Z.

Figure 22B:
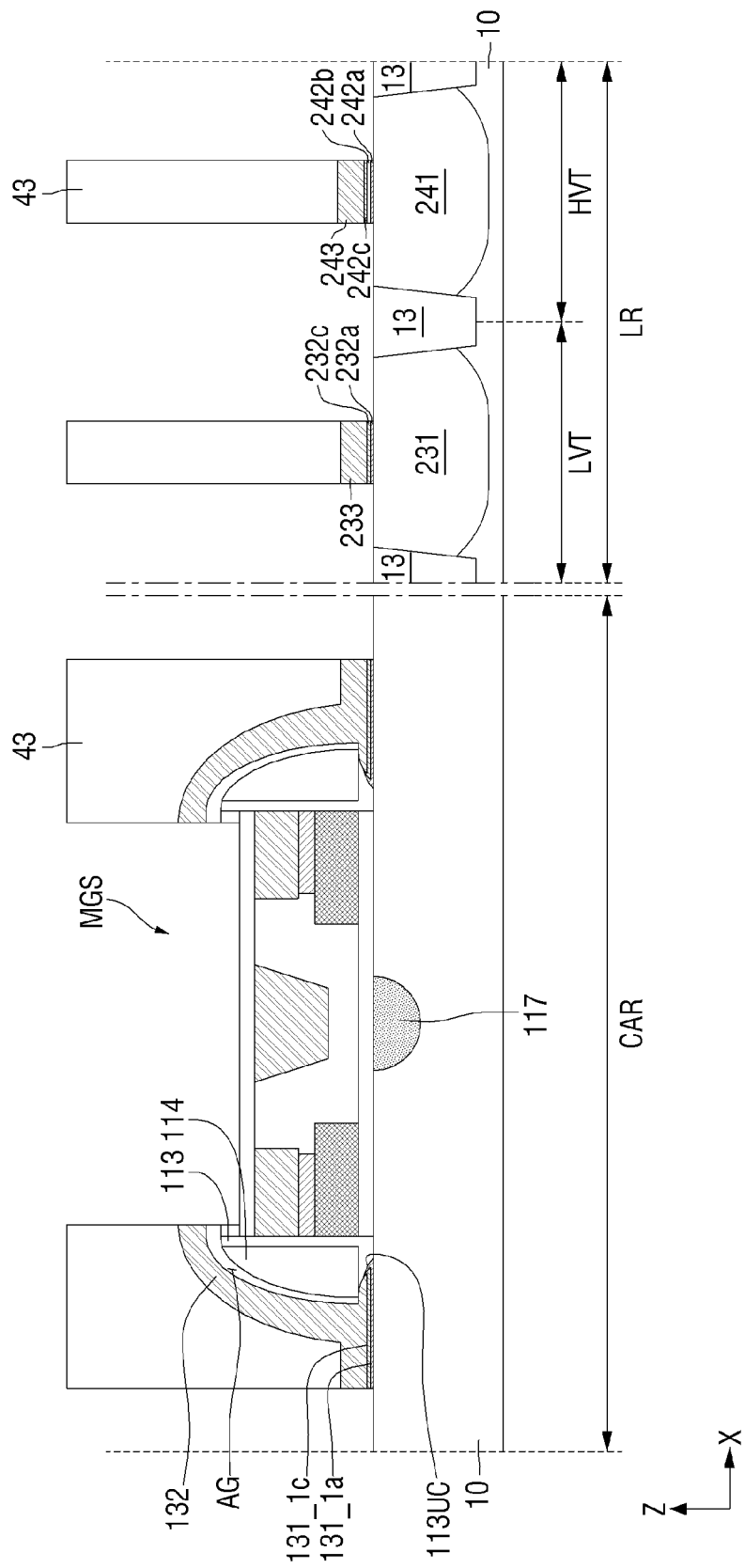

Referring additionally to FIG. 22B, when a wet etching process is performed in a state where the sidewalls of the $(2\_1)^{th}$ select high-k films 131_2a and the $(2\_3)^{th}$ select high-k films 131_2c are exposed, the $(2\_1)^{th}$ select high-k films 131_2a and the $(2\_3)^{th}$ select high-k films 131_2c may be removed to form air gaps AG. For example, the wet etching process may be a stripping process performed on each second capping pattern 116 by using phosphoric acid ($H_3PO_4$), but example embodiments are not limited thereto.

However, because the $(1\_1)^{th}$ select high-k films 131_1a and the $(1\_3)^{th}$ select high-k films 131_1c are separated from the $(2\_1)^{th}$ select high-k films 131_2a and the $(2\_3)^{th}$ select high-k films 131_2c by the select gates 132, they are not affected by penetration of phosphoric acid ($H_3PO_4$) due to the wet etching process. For example, the select gates 132 may have a greater chemical resistance to the wet etching process than the $(2\_1)^{th}$ select high-k films 131_2a and the $(2\_3)^{th}$ select high-k films 131_2c.

As illustrated in FIG. 22B, when the $(2\_1)^{th}$ select high-k films 131_2a and the $(2\_3)^{th}$ select high-k films 131_2c are replaced with the air gaps AG, the select high-k films 131' of FIG. 2B may be formed.

Figure 23:
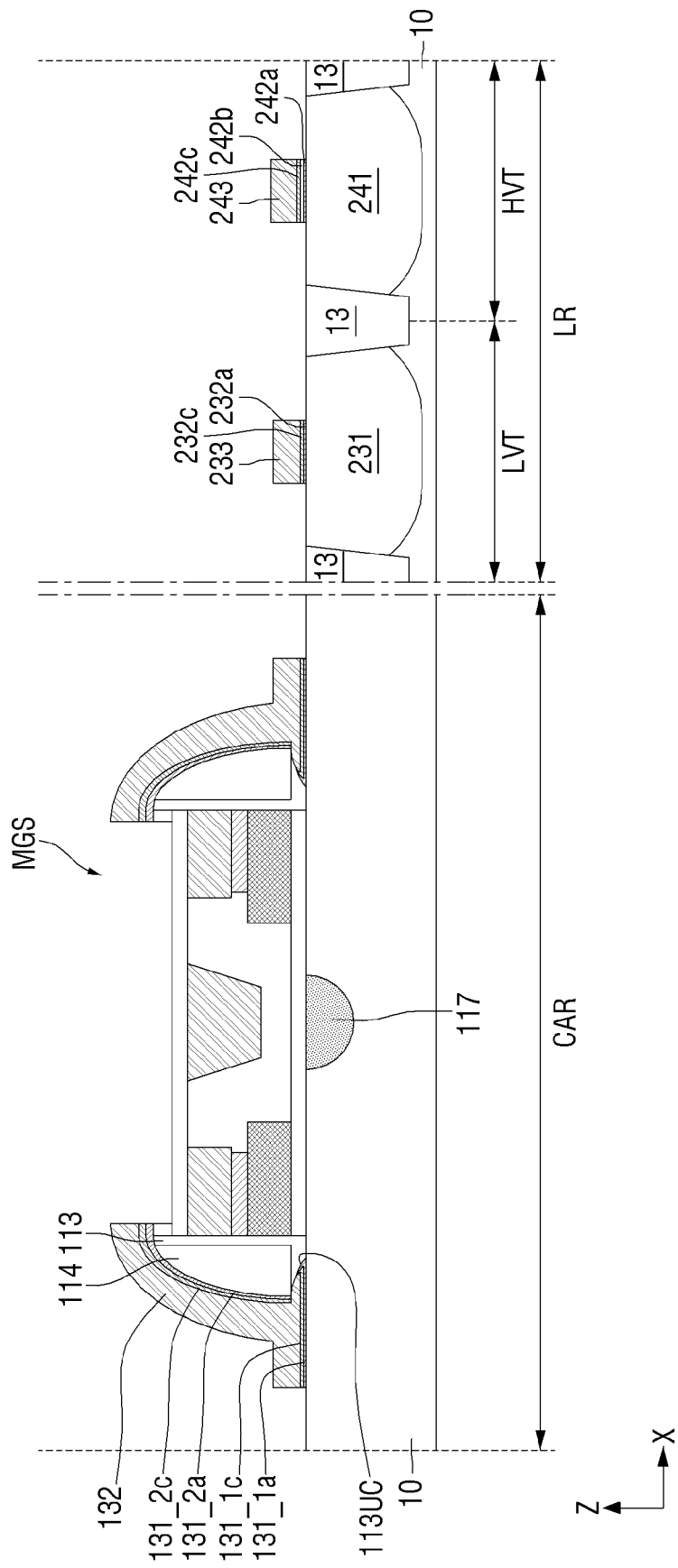
Figure 24:
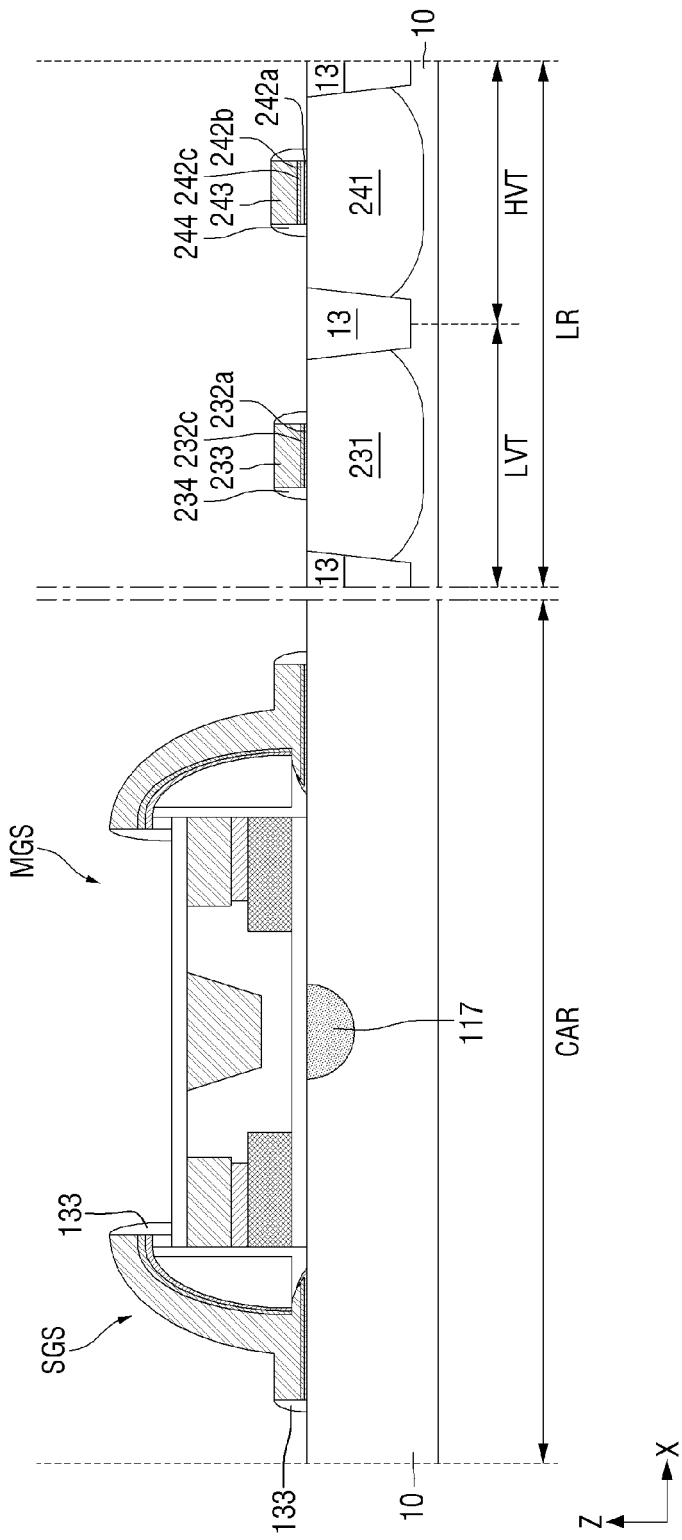

Referring to FIGS. 23 and 24, the fourth photoresist patterns 43 are removed, and third spacers 133 are formed in the memory cell array region CAR to form the select gate structures SGS. In addition, low-voltage spacers 234 are formed in the low-voltage transistor region LVT to form a low-voltage gate structure, and high-voltage spacers 244 are formed in the high-voltage transistor region HVT to form a high-voltage gate structure.

Figure 25:
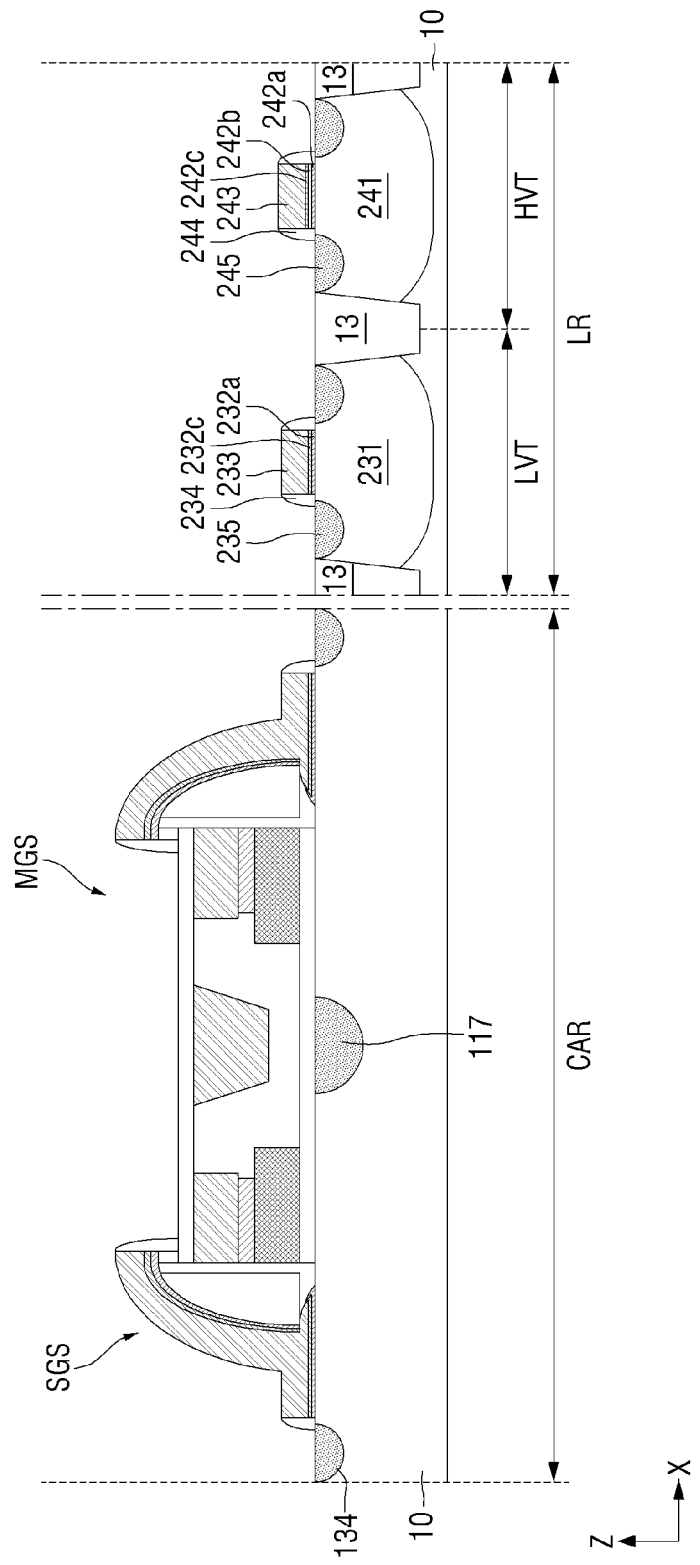

Referring to FIG. 25, second sources/drains 134, low-voltage sources/drains 235, and high-voltage sources/drains 245 are formed using the memory gate structure MGS, the select gate structures SGS, the low-voltage gate structure and the high-voltage gate structure as an ion implantation mask. The select transistor $T_S$ and the memory transistor $T_M$ of FIG. 4 are formed in the memory cell array region CAR, a low-voltage transistor is formed in the low-voltage transistor region LVT, and a high-voltage transistor is formed in the high-voltage transistor region HVT.

At least a part of each select gate 132 of the semiconductor device 1 may be recessed toward the undercut sidewall 113UC between the upper surface of the substrate 10 and the lower surface of the second spacer 114 to contact a part of the undercut sidewall 113UC. Each select gate 131 may physically separate a first select high-k film 131_1 and a second select high-k film 131_2. Through the physical separation, it is possible to protect the first select high-k film 131_1 despite penetration due to a wet etching process in the wet etching process as in FIG. 22B and possible to prevent failure of the select transistor $T_S$.

In addition, because the first select high-k film 131_1 can be protected through the structure of each select gate 131, high-k films can be formed together in the memory cell array region CAR and the logic region LR as in the processes of FIGS. 12 through 22A, and unnecessary layer waste can be prevented.

Although embodiments have been described in more detail with reference to the accompanying drawings, the present disclosure is not necessarily limited to these embodiments. The present disclosure may be implemented in various modified manners within the scope not departing from the technical idea of the present disclosure. Accordingly, the example embodiments disclosed herein are not intended to limit the technical idea of the present disclosure, but to describe the present disclosure. the scope of the technical idea of the present disclosure is not limited by the embodiments. Therefore, it should be understood that the example embodiments described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A semiconductor device comprising:
    a floating gate disposed on a substrate;
    a memory gate disposed on the floating gate;
    a first spacer disposed on a sidewall of the floating gate, a sidewall of the memory gate and an upper surface of the substrate;
    a second spacer disposed on the first spacer;
    a select high dielectric constant (high-k) film disposed on a first portion of a sidewall of the first spacer between the substrate and the second spacer; and
    a select gate disposed on a second portion of the sidewall of the first spacer between the substrate and the second spacer,
    wherein the upper surface of the substrate extends along a first direction and a second direction that crosses the first direction, a third direction is perpendicular to the upper surface of the substrate, a width of a portion of the first spacer in the first direction is reduced as a distance to the substrate decreases along the third direction, and the portion of the first spacer is disposed between the substrate and the second spacer.

2. The semiconductor device of claim 1, wherein a first surface of the first spacer contacts the substrate and extends in the first direction, and a second surface of the first spacer contacts the second spacer and extends in the first direction, wherein the second surface protrudes further in the first direction than the first surface.

3. The semiconductor device of claim 2, further comprising a tunnel insulating layer disposed between the substrate and the floating gate,
    wherein the sidewall of the first spacer is recessed toward the tunnel insulating layer, and the select gate is disposed between the substrate and the sidewall of the first spacer.

4. The semiconductor device of claim 1, wherein the select high-k film comprises titanium nitride (TiN).

5. The semiconductor device of claim 4, wherein the select gate has a greater chemical resistance to phosphoric acid stripping than the select high-k film.

6. The semiconductor device of claim 1, wherein the select high-k film comprises a first select high-k film and a second select high-k film, the first select high-k film is disposed between the substrate and the second spacer, the second select high-k film is disposed between the second spacer and the select gate, and the first select high-k film and the second select high-k film are physically separated by the select gate.

7. The semiconductor device of claim 1, further comprising an air gap between a sidewall of the second spacer and the select gate.

8. The semiconductor device of claim 1, wherein the select gate covers a top surface of the first spacer, a top surface of the second spacer, and at least a portion of the memory gate.

9. The semiconductor device of claim 8, further comprising a capping pattern disposed between the memory gate and the select gate.

10. A semiconductor device comprising:
a floating gate disposed on a substrate in a first region;
a memory gate disposed on the floating gate;
a first spacer disposed on a sidewall of the floating gate, a sidewall of the memory gate and an upper surface of the substrate;
a second spacer disposed on the first spacer;
a first select high-k film disposed on the upper surface of the substrate and a first portion of a sidewall of the first spacer between the substrate and the second spacer;
a first high-k film disposed on the substrate in a second region different from the first region; and
a first gate disposed on the first high-k film,
wherein the upper surface of the substrate extends along a first direction and a second direction that crosses the first direction, a third direction is perpendicular to the upper surface of the substrate, a width of a portion of the first spacer in the first direction is reduced as a distance the substrate decreases along the third direction, the first spacer is disposed between the substrate and the second spacer, and the first high-k film and the first select high-k film comprise a common material.

11. The semiconductor device of claim 10, wherein the first high-k film and the first select high-k film comprise TiN.

12. The semiconductor device of claim 10, wherein the first gate and the first high-k film form a low-voltage transistor.

13. The semiconductor device of claim 12, wherein the first select high-k film and the first high-k film have a common thickness.

14. The semiconductor device of claim 10, wherein a first surface of the first spacer contacts the substrate and extends in the first direction, a second surface of the first spacer contacts the second spacer and extends in the first direction, and the second surface protrudes further in the first direction than the first surface.

15. The semiconductor device of claim 14, further comprising:
a tunnel insulating layer disposed between the substrate and the floating gate; and
a select gate disposed between a lower surface of the second spacer and the upper surface of the substrate, wherein the sidewall of the first spacer is recessed toward the tunnel insulating layer, and the select gate is disposed between the substrate and the sidewall of the first spacer.

16. A method of manufacturing a semiconductor device, the method comprising:
providing a substrate comprising a first region and a second region different from the first region;
forming a memory gate structure on the first region of the substrate, the memory gate structure comprising a floating gate, a memory gate, a first spacer formed along a sidewall of the floating gate, a sidewall of the memory gate and an upper surface of the substrate, and a second spacer disposed on the first spacer;
forming an oxide layer on the substrate and the memory gate structure;
etching a portion of the first spacer between the substrate and the second spacer, together with the oxide layer;
forming a high-k layer on the substrate, wherein a portion of the high-k layer is disposed between the substrate and the second spacer along a sidewall of the first spacer; and
forming a conductive layer such that a portion of the conductive layer is disposed on the high-k layer between the substrate and the second spacer,
wherein a width of a portion of the first spacer in a first direction is reduced as a distance to the substrate decreases.

17. The method of claim 16, further comprising etching a portion of the high-k layer and a portion of the conductive layer to form a select high-k film and a select gate in the first region, and a first high-k film and a first gate in the second region.

18. The method of claim 17, wherein the select high-k film is disposed on a first portion of the sidewall of the first spacer between the substrate and the second spacer, and the select gate is disposed on a second portion of the sidewall of the first spacer between the substrate and the second spacer.

19. The method of claim 16, wherein the etching of the first spacer is performed through wet etching, and the sidewall of the first spacer is recessed toward the floating gate.

20. The method of claim 19, wherein the wet etching uses at least one of a hydrogen fluoride (HF) solution and a buffered oxide etch (BOE) solution.

* * * * *